(12) United States Patent
Masuda

(10) Patent No.: US 8,447,539 B2
(45) Date of Patent: May 21, 2013

(54) ELECTROMAGNETIC FIELD DISTRIBUTION MEASUREMENT APPARATUS

(75) Inventor: Norio Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 599 days.

(21) Appl. No.: 12/665,767

(22) PCT Filed: Apr. 23, 2008

(86) PCT No.: PCT/JP2008/057829
§ 371 (c)(1),
(2), (4) Date: Dec. 21, 2009

(87) PCT Pub. No.: WO2009/004856
PCT Pub. Date: Jan. 8, 2009

(65) Prior Publication Data
US 2010/0174497 A1    Jul. 8, 2010

(30) Foreign Application Priority Data
Jun. 29, 2007    (JP) ................................. 2007-171953

(51) Int. Cl.
*G01R 15/00*    (2006.01)
(52) U.S. Cl.
USPC ................... 702/57; 702/85; 702/94; 702/95; 702/104
(58) Field of Classification Search
USPC .................. 702/57, 85, 94–95, 104; 356/614, 356/625; 335/42, 45
See application file for complete search history.

(56) References Cited

U.S. PATENT DOCUMENTS

| 6,564,158 | B1 * | 5/2003 | Rabel et al. ...................... 702/57 |
| 7,541,818 | B2 * | 6/2009 | Kosaka et al. ............ 324/754.29 |
| 7,945,309 | B2 * | 5/2011 | Govari .......................... 600/424 |

FOREIGN PATENT DOCUMENTS

| JP | 4-230874 | A | 8/1992 |
| JP | 11-202009 | A | 7/1999 |
| JP | 3102420 | B | 8/2000 |
| JP | 2000214198 | A | 8/2000 |
| JP | 2001311756 | A | 11/2001 |
| JP | 2003185689 | A | 7/2003 |
| JP | 2006003135 | A | 1/2006 |

OTHER PUBLICATIONS

International Search Report for PCT/JP2008/057829 mailed Jul. 15, 2008.

* cited by examiner

*Primary Examiner* — Eliseo Ramos-Feliciano
*Assistant Examiner* — Elias Desta

(57) ABSTRACT

An electromagnetic field distribution measurement apparatus (10) according to the present invention includes: an electromagnetic field probe (20) for measuring an electromagnetic field distribution; a scan apparatus (30) for scanning the vicinity of a wiring (120) with the electromagnetic field probe (20); and a data processing apparatus (50) for calculating the offset value ($\Delta Xd$) of the coordinate of the electromagnetic field probe (20) from the coordinate of the wiring (120). The data processing apparatus (50) extracts a characteristic point (E1 to E3) of the measured electromagnetic field distribution and calculates the offset value ($\Delta Xd$) based on the coordinates of the extracted characteristic point (E1 to E3).

13 Claims, 21 Drawing Sheets

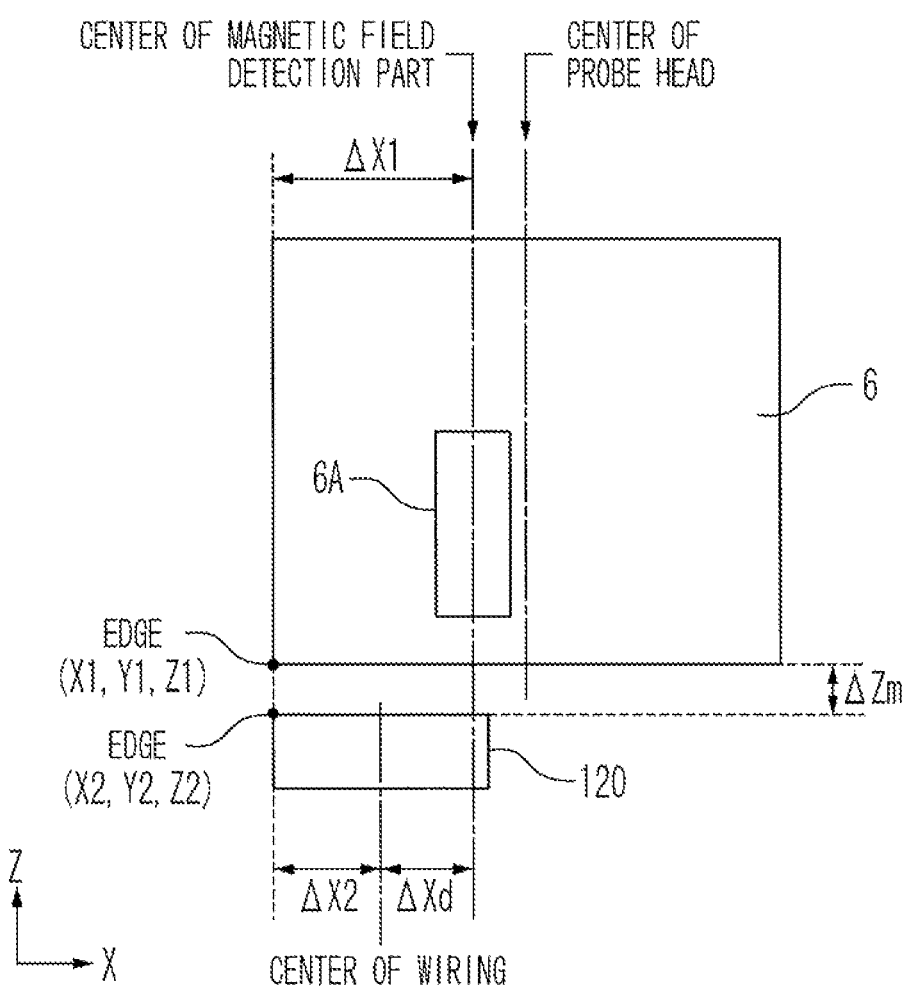

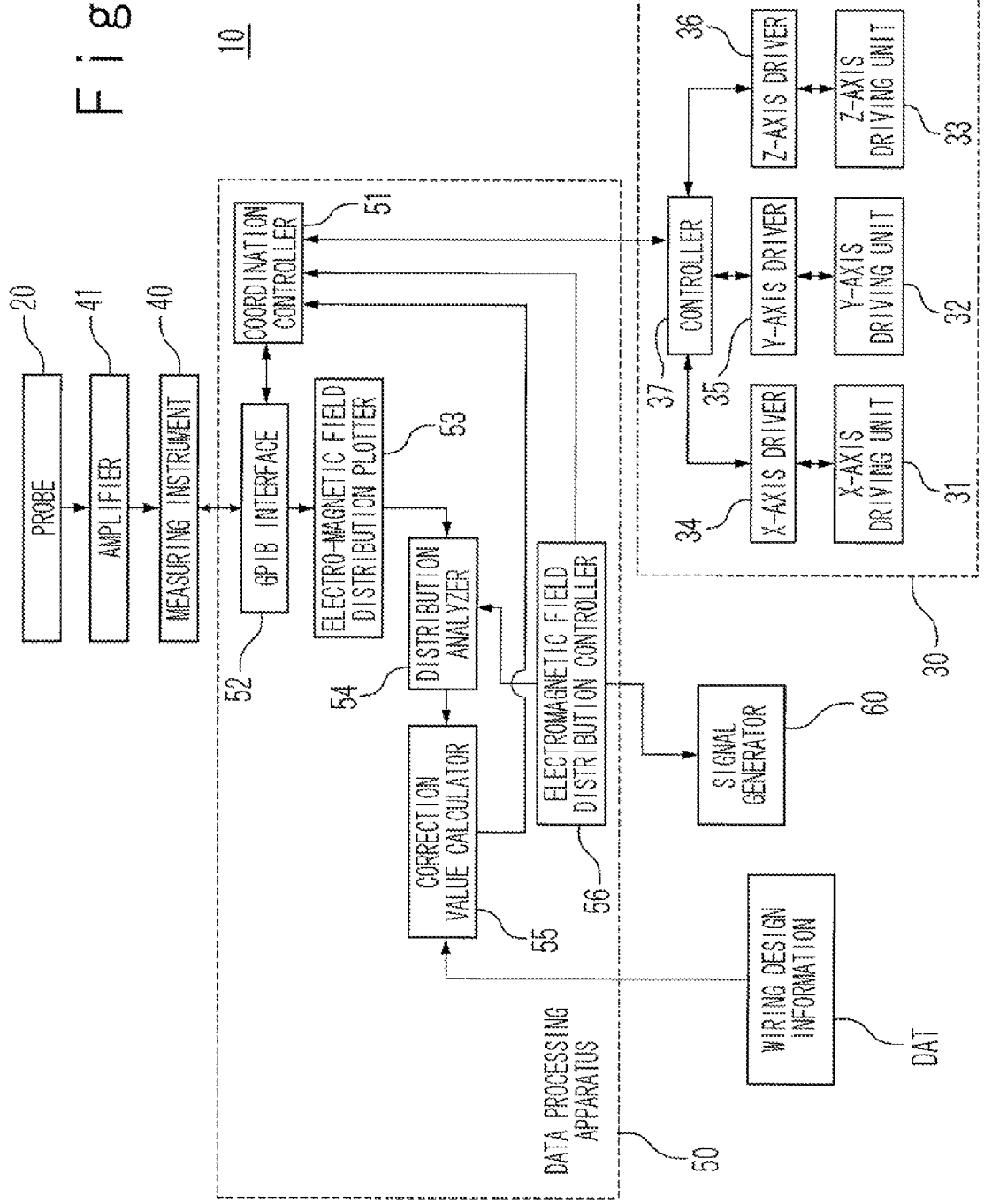

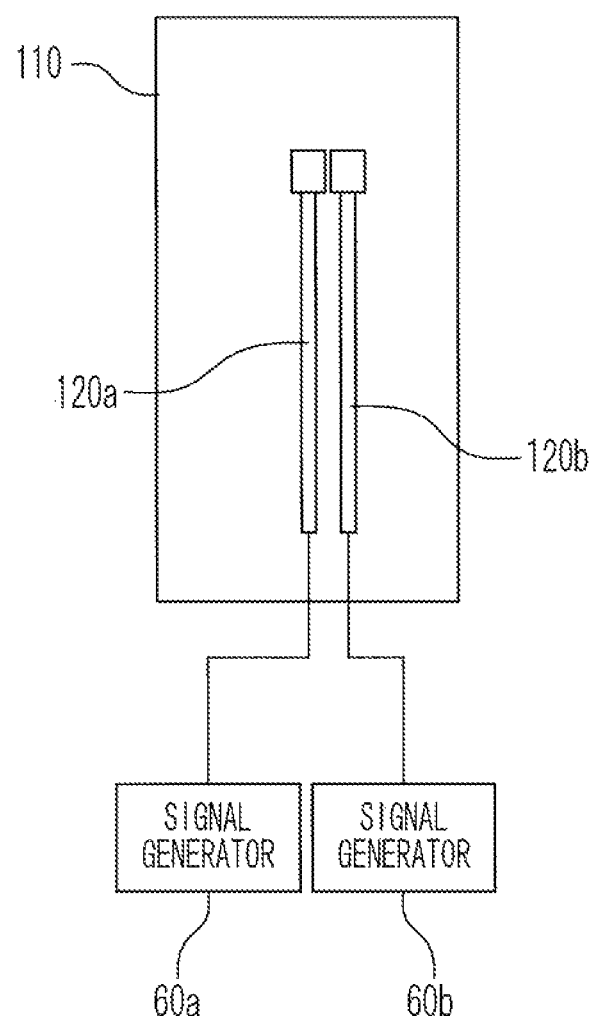

ELECTROMAGNETIC FIELD DISTRIBUTION MEASUREMENT APPARATUS

TECHNICAL FIELD

The present invention relates to an electromagnetic field distribution measurement apparatus which measures electromagnetic field distribution in the vicinity of a printed wiring board or an LSI.

The present application is the National Phase of PCT/JP2008/057829, filed Apr. 23, 2008, which claims a priority based on Japanese Patent Application No. 2007-171953, which was filed on Jun. 29, 2007, and the present application includes the entire disclosures thereof here.

BACKGROUND ART

Upon the operation of an electronic device, there is a possibility that an unintended electromagnetic field is generated and this electromagnetic field interferes with other electronic device as electromagnetic noises. Such a phenomenon is referred to as an Electromagnetic Interference (EMI). In order to prevent the generation of the accident due to this electromagnetic interference, rules with regard to the electromagnetic noise is provided by various countries and regions. A typical one is a self-regulation formulated by the Voluntary Control Council for Interference by Information Technology Equipment (VCCI).

In order to prevent the electromagnetic interference, it is important to identify the place where the electromagnetic noise is generated in the design stage of an electronic device and find out the generation mechanism of the electromagnetic noise. Therefore, it is effective to measure the electromagnetic field leaked from a component such as an IC and a Printed Wiring Board (PWB) with a high spatial resolution. As an apparatus that is used in such a case, "an electromagnetic field distribution measurement apparatus" is known (for example, refer to Japanese Laid-Open Patent Application JP-A-Heisei, 4-230874). The electromagnetic field distribution measurement apparatus serves to perform scan by an electromagnetic field probe in the vicinity of a PWB and an LSI to measure the electromagnetic field distribution in the vicinity thereof. On the contrary, a device to irradiate an electromagnetic field from an electromagnetic field probe so as to identify the place that is fragile at the electromagnetic interference has been also known (for example, refer to Japanese Laid-Open Patent Application JP-P2006-3135A).

FIG. 1 illustrates a common electromagnetic field distribution measurement apparatus. A product under test 100 is placed on a stage 1. An electromagnetic field probe 2 is connected to a scanning device 3. The scanning device 3 is provided with an X-axis driving unit, a Y-axis driving unit, and a Z-axis driving unit, and thereby, the scanning device 3 is capable of performing scanning by the electromagnetic field probe 2 in X, Y, and Z directions. Thereby, the electromagnetic field probe 2 is capable of measuring an electromagnetic field that is irradiated from the product under test 100. By analyzing the output of the electromagnetic field probe 2 with a spectrum analyzer, an electromagnetic field map is created. By extracting a place corresponding to the intensity of signal from that electromagnetic field map, it is possible to obtain information about a place where an electromagnetic noise is generated and a passage of an electromagnetic noise. Further, an electromagnetic field distribution measurement apparatus having a function to rotate the electromagnetic field probe 2 added thereto can also be considered.

With regard to the method of measuring electromagnetic noises, by the International Electrotechnical Commission (IEC), IEC61967-3 is provided as a Technical Specification (TS). According to IEC61967-3, it is required to manage the position of measurement in units of tens of μm in order to make precise measurement on an LSI chip. It is important for measurement of the electromagnetic noise with such a high spatial resolution to precisely control the position of the electromagnetic field probe 2 and remove "displacement of position".

In order to enhance the spatial resolution further, in recent years, the electromagnetic field probe 2 itself has been miniaturized. For example, as described in Japanese Patent No. 3102420, by using the fine semiconductor process, a minute electromagnetic field probe having the spatial resolution about 10 μm had been developed. In this case, it is necessary to adjust the position of the front end of the electromagnetic field probe 2 to the position of a target of measurement with the accuracy finer than 10 μm. In order to prevent the displacement of the position due to a microscopical vibration, there are cases that the whole electromagnetic field distribution measurement apparatus is mounted on a vibration isolation table 4 as shown in FIG. 1.

The electromagnetic field probe 2 is placed on the electromagnetic field distribution measurement apparatus by using an accurate installation jig. However, as the electromagnetic field probe 2 is miniaturized as described above, it has been becoming difficult to place the electromagnetic field probe 2 on a desired installation position. The manufacture tolerance of the electromagnetic field probe 2 itself has been becoming relatively large compared to the accuracy with regard to a required space coordinate, so that it has been becoming difficult to control the installation position of the electromagnetic field probe 2 in the order of micrometer. As a result, it is becoming difficult to precisely adjust the position of the electromagnetic field probe 2 to the coordinate of a target of measurement only by the machine coordinate of the electromagnetic field distribution measurement apparatus.

In order to precisely adjust the position of the electromagnetic field probe 2 to the coordinate of the target of measurement, a camera 5 is placed on the electromagnetic field distribution measurement apparatus shown in FIG. 1. Obtaining an image of the product under test 100 and the electromagnetic field probe 2 by using this camera, an operator is capable of confirming if the electromagnetic field probe 2 is located on a desired position on the product under test 100 or not.

FIG. 2A is a schematic view for explaining the measuring operation of an electromagnetic field that is irradiated from a product under test 100. As an example thereof, the product under test 100 having a printed wiring board 110 and a wiring 120 that is formed on the printed wiring board 110 is considered. The printed wiring board 110 is manufactured by a material such as glass epoxy. The wiring 120 is formed along the Y direction. The electromagnetic field probe 2 is arranged on the wiring 120 of the product under test 100. This electromagnetic field probe 2 has a probe head 6 at its front end.

FIG. 2B schematically illustrates the cross sections of the probe head 6 of the electromagnetic field probe 2 and the printed wiring board 110. The electromagnetic field probe 2 is a magnetic field probe that is defined by IEC61967-6, for example, and the probe head 6 thereof is manufactured by a multilayer substrate. At this time, in many cases, a magnetic field detection part 6A, which converts a magnetic field into a voltage, a current, and a distortion or the like, is formed on the inner layer of the multilayer substrate of the probe head 6. In this case, the magnetic field detection part 6A cannot be visually observed from the outside.

Generally, in the case of making a measurement of an electromagnetic field with the wiring 120 as a target of measurement, the intensity of the electromagnetic field just above the wiring 120 is high, and the distribution of the electromagnetic field is formed being symmetrical to the center of the wiring 120. Therefore, it is convenient to make a calibration in order to adjust the center of the wiring 120 to the center of the magnetic field detection part 6A. However, the reference point for the calibration does not necessarily be the center of the wiring 120, and this reference point is decided depending on the object of measuring. For simplicity, the operation to adjust the center of the wiring 120 to the center of the magnetic field detection part 6A will be described here. As described above, in a case where the magnetic field detection part 6A is integrated in the multilayer substrate of the probe head 6, the operator is not capable of visually observing the magnetic field detection part 6A from the outside. In such a case, the following operation may be considered in order to adjust the center of the wiring 120 to the center of the magnetic field detection part 6A.

At first, as shown in FIG. 2C, alignment is carried out so that the external edge of the probe head 6 is aligned with the edge of the wiring 120. In this case, the alignment is visually carried out by using a camera 5. In other words, the operator confirms that a machine coordinate X1 of the edge of the probe head 6 is coincident with a machine coordinate X2 of the edge of the wiring 120 on the basis of the image obtained by the camera 5.

On the other hand, it is assumed that the distance from the edge of the probe head 6 to the center of the magnetic field detection part 6A is ΔX1, and the distance from the edge of the wiring 120 to the center of the wiring 120 is ΔX2. Typically, the magnetic field detection part 6A is designed to be formed on the center line of the probe head 6, and the distance ΔX1 can be calculated by the measurement of the outline of the probe head 6. In addition, it is possible to recognize the distance ΔX2 depending on the actual measured value of the width of the wiring 120.

When the alignment shown in FIG. 2C is carried out, the offset value ΔXd of the center line of the magnetic field detection part 6A with respect to the centerline of the wiring 120 is ΔX1-ΔX2. As a result, by correcting the position of the probe head 6 by the offset value ΔXd after the above-described alignment, it is possible to adjust the center line of the magnetic field detection part 6A to the center line of the wiring 120 in principle.

As described above, by using the camera 5, alignment of the magnetic field detection part 6A of the electromagnetic field probe 2 and the wiring 120 is possible in principle. Further, as shown in FIG. 2B, the camera 5 takes images of the probe head 6 and the wiring 120 from an oblique angle. This is because the distance ΔZm between the probe head 6 and the product under test 100 (refer to FIG. 2C) is not more than 1 mm, and the camera 5 cannot be inserted into the gap between the probe head 6 and the product under test 100. In the case of making measurement on a semiconductor chip, the distance ΔZm may be made less than 1 μm because it is necessary to enhance the spatial resolution to the utmost limit.

The inventor of the present application focused on the following points. According to the above-described method using the camera 5, there is a possibility that the alignment of the magnetic field detection part 6A and the wiring 120 of a measurement target may have some errors.

One factor of the errors is a processing accuracy of the fine probe head 6. In the case where the probe head 6 is manufactured by a printed wiring board or a ceramic substrate, it is difficult to trim the edge of this substrate with high accuracy. Depending on the material, a roughness of the surface of the substrate may be in the range of tens μm to hundreds μm. Accordingly, there is a possibility that errors may be generated when carrying out alignment while visually observing the edge of the probe head 6.

In addition, if the magnetic field detection part 6A is formed on the center axis of the probe head 6, the above-described calculation of the distance ΔX1 can be made relatively easily. However, because of reasons of design and manufacture, as shown in FIG. 2C, the magnetic field detection part 6A may be displaced from the center axis of the probe head 6. In other words, there is a possibility that the position where the magnetic field detection part 6A is manufactured is displaced from the design position of the magnetic field detection part 6A. In this case, it is necessary to calculate the distance ΔX1 according to special methods, for example, by using an X-ray or the like, and this also becomes a factor of errors.

Further, as described above, the camera 5 takes pictures of the probe head 6 and the wiring 120 at an oblique angle. As a result, depending on the sharpness of the image, the size of the distance (ΔZm) between the probe head 6 and the wiring 120 or the like, the errors in alignment are increased. Particularly, in a case where the distance cannot be made sufficiently-small, it becomes difficult to visually observe that the coordinate X1 of the edge of the probe head 6 is coincident with the coordinate X2 of the edge of the wiring 120.

DISCLOSURE OF INVENTION

An object of the present invention is to provide a technique capable of enhancing the accuracy of spatial alignment between an electromagnetic probe and a target of measurement.

According to an aspect of the present invention, an electromagnetic field distribution measurement apparatus includes: an electromagnetic field probe for measuring electromagnetic field distribution; a scan apparatus for scanning a vicinity of wiring by the electromagnetic field probe; and a data processing apparatus for calculating an offset value of a coordinate of the electromagnetic field probe from the coordinate of the wiring. The data processing apparatus extracts a characteristic point of the measured electromagnetic field distribution, and calculates the offset value based on a coordinate value of the extracted characteristic point.

In this way, it is not necessary to visually adjust the coordinate of the edge of the probe head to the coordinate of the edge of the wiring. Accordingly, the influences of the above-described errors can be removed. In other words, it becomes possible to accurately calculate the offset value and enhance the accuracy of spatial alignment between the electromagnetic probe and the target of measurement.

Further, it is not necessary to visually observe the edge of the probe head and the edge of the wiring. As a result, even in the case where any of the probe head and the wiring cannot be visually observed, it is possible to carry out the alignment with high accuracy. For example, when the wiring is placed in the inner layer of the product under test, the present invention can be applied.

BRIEF DESCRIPTION OF DRAWINGS

FIG. 2C is a schematic view for explaining a conventional calculation method of an offset value;

FIG. 7 is a block diagram showing a configuration of an electromagnetic field distribution measurement apparatus according to a second exemplary embodiment of the present invention;

FIG. 9A is a schematic view for explaining another example of the calculation method of the offset value according to the second exemplary embodiment of the present invention;

BEST MODE FOR CARRYING OUT THE INVENTION

Referring to the accompanying drawings, the electromagnetic field distribution measurement apparatus according to exemplary embodiments of the present invention will be described below.

1. First Exemplary Embodiment

1-1. Configuration

Figure 1:
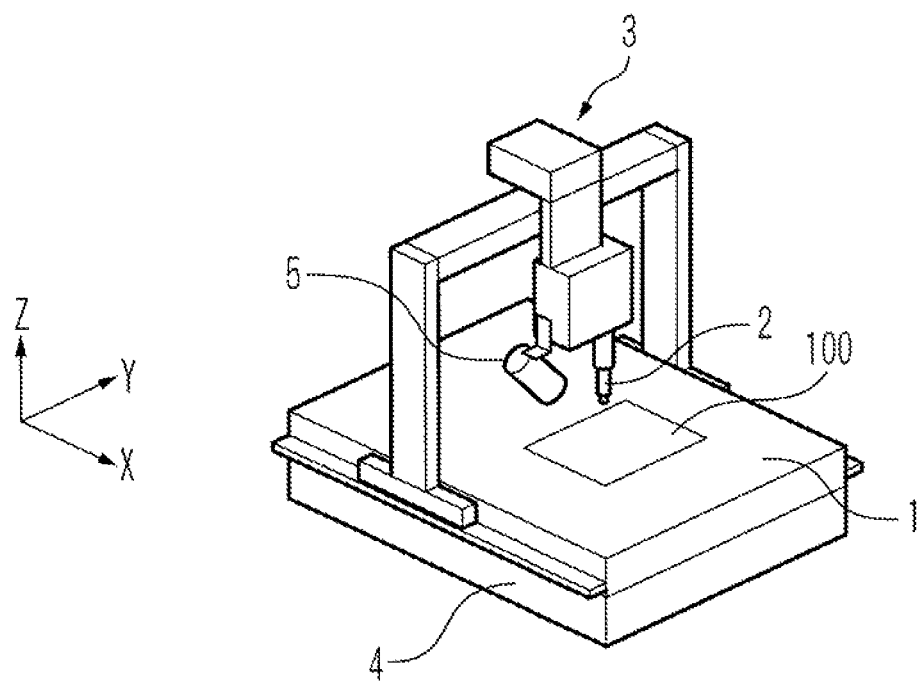
FIG. 1 is an overall view showing a configuration of a conventional electromagnetic field distribution measurement apparatus.
Figure 2A:
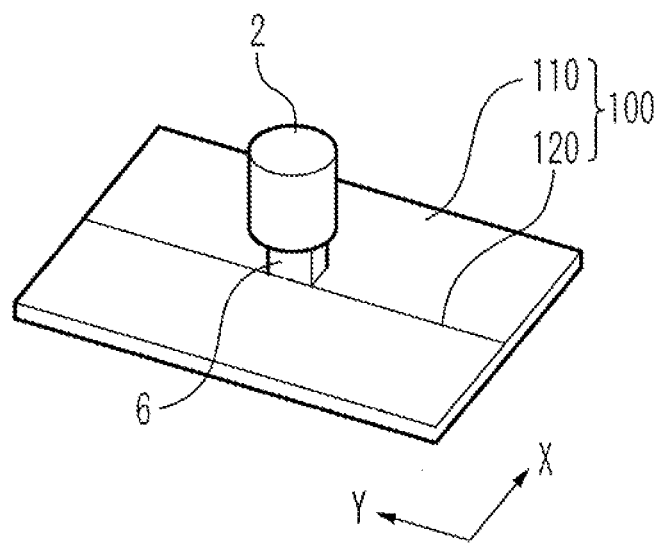
FIG. 2A is a schematic view for explaining a measuring operation of an electromagnetic field.
Figure 2B:
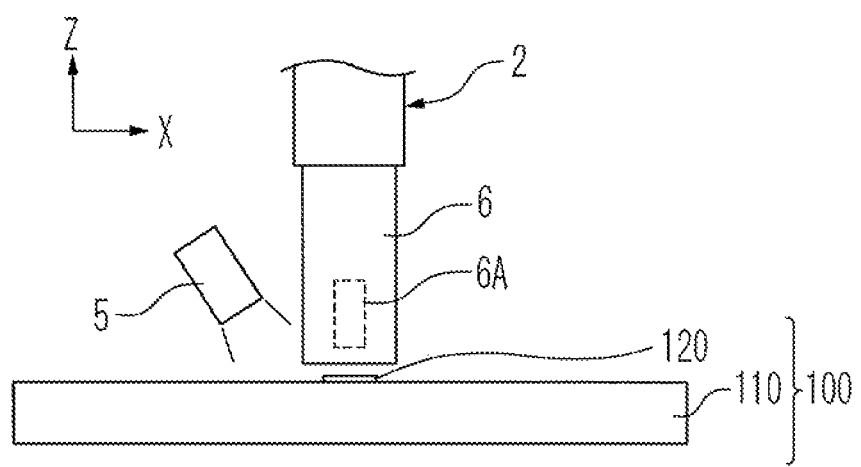
FIG. 2B is a schematic view showing a cross section of a probe head of an electromagnetic field probe and a product under test.
Figure 3:
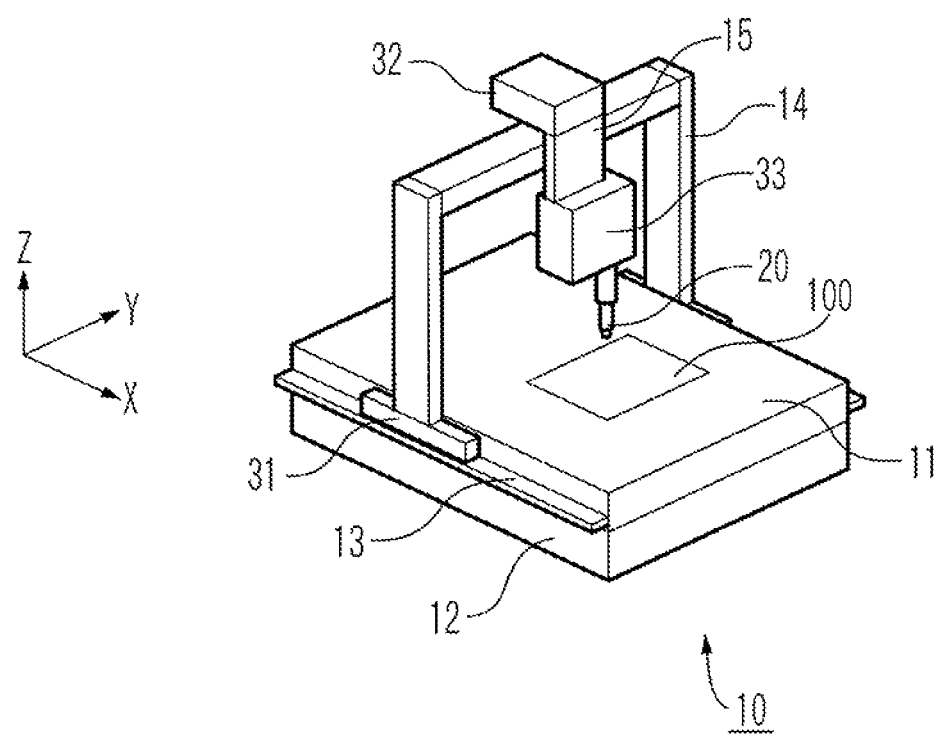
FIG. 3 is an overall view showing a configuration of an electromagnetic field distribution measurement apparatus according to a first exemplary embodiment of the present invention.

FIG. 3 is an overall view showing a configuration of an electromagnetic field distribution measurement apparatus 10 according to a first exemplary embodiment of the present invention. This electromagnetic field distribution measurement apparatus 10 is provided with a stage 11, a vibration isolation table 12, a guide rail 13, an arm 14, a measuring arm 15, an electromagnetic field probe 20, an X-axis driving unit 31, a Y-axis driving unit 32, and a Z-axis driving unit 33. The product under test 100 is placed on the stage 11. In order to prevent the displacement of the electromagnetic field probe 20 due to the microscopical vibration, the whole electromagnetic field distribution measurement apparatus is mounted on the vibration isolation table 12.

The electromagnetic field probe 20 serves as a component for measuring the electromagnetic field distribution in the vicinity of the product under test 100 and mounted on the electromagnetic field distribution measurement apparatus 10. The X-axis driving unit 31, the Y-axis driving unit 32, and the Z-axis driving unit 33 are precise driving components and these driving parts are capable of performing scanning by the electromagnetic field probe 20 in X, Y, and Z directions. Specifically, the X-axis driving unit 31 moves along the guide rail 13 in the X-axis direction. The arm 14 is fixed to the X-axis driving unit 31 and the Y-axis driving unit 32 moves on that arm 14 in the Y-axis direction. The measuring arm 15 is fixed to the Y-axis driving unit 32 and the Z-axis driving unit 33 moves on that measuring arm 15 in the Z-axis direction. The electromagnetic field probe 20 is mounted on the Z-axis driving unit 33 along the axis of the measuring arm 15. Thereby, it is possible to move the electromagnetic field probe 20 to a desired position on the product under test 100. The machine coordinate of the electromagnetic field probe 20 is obtained by the X-axis driving unit 31, the Y-axis driving unit 32, and the Z-axis driving unit 33.

Figure 4A:
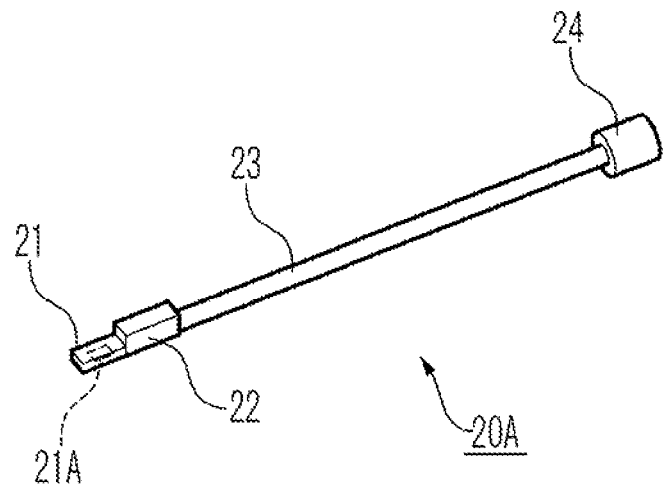
FIG. 4A is a schematic view showing an example of a structure of the electromagnetic field probe.

FIG. 4A illustrates an example of the electromagnetic field probe 20 according to the present exemplary embodiment. Particularly, FIG. 4A illustrates an example of a magnetic field probe 20A that has been developed in order to make measurement of an electromagnetic field in the vicinity of the LSI. The magnetic field probe 20A has a probe head 21. The probe head 21 is mounted on an end of a coaxial cable 23 via a connection part 22. Other end of the coaxial cable 23 is connected to a connector 24. Generally, as an electromagnetic filed probe, a system that converts an electromagnetic field into a voltage, a current, a distortion, light or the like and output them is considered. According to an example shown in FIG. 4A, a voltage induced by a magnetic field is detected by a magnetic field detection part 21A that is located inside of the probe head 21. Such a magnetic field probe 20A has been frequently used for measurement at a high frequency band more than 1 MHz.

Figure 4B:
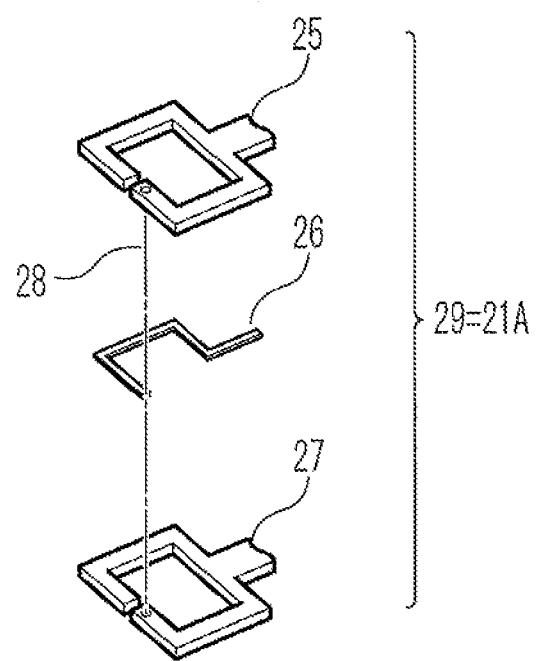
FIG. 4B is a schematic view showing an example of a structure of a magnetic field detection part that is included in a probe head.

FIG. 4B illustrates an example of a structure of the magnetic field detection part 21A that is included in the probe head 21. The magnetic field detection part 21A is configured by a magnetic field loop 29. Specifically, a first conductor layer 25, a second conductor layer 26, and a third conductor layer 27 are formed inside of the probe head 21, and these conductor layers 25 to 27 are connected with each other through a via 28. As shown in FIG. 4B, the conductor layers 25 to 27 form the magnetic field loop 29 of an electric field shield type. This magnetic field loop 29 configures the magnetic field detection part 21A. For convenience of a manufacture process, the magnetic field loop 29 may not be capable of being formed on a geometrical center of the probe head 21. In this case, the magnetic field loop 29 is placed on the position that is asymmetrical to the outline of the probe head 21, so that it is not possible to precisely calculate the center of the magnetic field detection part 21A from an external dimension of the probe head 21.

The magnetic field probe 20A shown in FIGS. 4A and 4B is a small magnetic field probe of a loop type and has a high directionality and a high spatial resolution. The magnetic field probe 20A is placed perpendicular to the product under test 100. In addition, the magnetic field probe 20A is placed so that a side of the magnetic field loop 29 of the probe head 21 is arranged to be parallel with a wiring that is a target of measurement. The output from this magnetic field loop 29 is transferred via the coaxial cable 23. By the use of such a magnetic field probe 20A, it is possible to measure electromagnetic field distribution to a high frequency band with a high spatial resolution.

Figure 5:
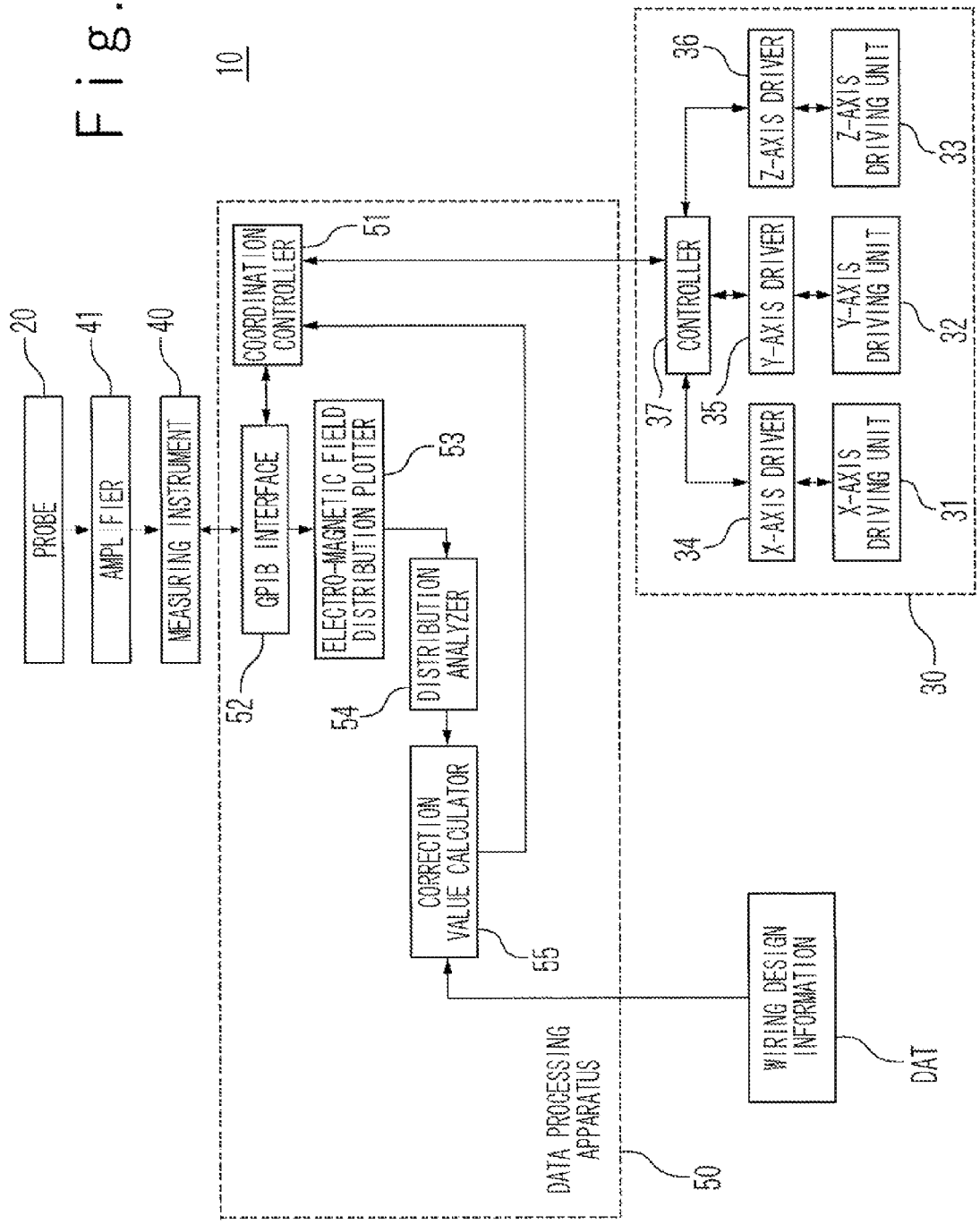
FIG. 5 is a block diagram showing a configuration of the electromagnetic field distribution measurement apparatus according to the first exemplary embodiment of the present invention.

FIG. 5 is a block diagram showing a configuration of the electromagnetic field distribution measurement apparatus 10 according to the present exemplary embodiment. The electromagnetic field distribution measurement apparatus 10 is provided with the electromagnetic field probe 20 (the magnetic field probe 20A), a scanning device 30, a measuring instrument 40, an amplifier 41, and a data processing apparatus.

The scanning device 30 has the aforementioned X-axis driving unit 31, Y-axis driving unit 32, and Z-axis driving unit 33. Further, the scanning device 30 has an X-axis driver 34, a Y-axis driver 35, a Z-axis driver 36, and a controller 37. The controller 37 receives data regarding the coordinate of the electromagnetic field probe 20 from the data processing apparatus. The controller 37 drives the driving parts 31 to 33 by means of the drivers 34 to 36 in response to the received coordinate data. Thereby, the electromagnetic field probe 20 is driven to the scanning.

The electromagnetic field probe 20 detects an electromagnetic field radiated from the product under test 100. An output from the electromagnetic field probe 20 is inputted to the measuring instrument 40 through the amplifier 41. The measuring instrument 40 measures the output of the electromagnetic field probe 20 and transmits the measurement result to the data processing apparatus. The measuring instrument 40 is, for example, a spectrum analyzer or an oscilloscope.

The data processing apparatus is capable of creating an electromagnetic filed map indicating the electromagnetic field distribution in the vicinity of the product under test 100 on the basis of the output of the electromagnetic field probe 20 to be transmitted from the measuring instrument 40. By extracting a place corresponding to intensities of signals from this electromagnetic filed map, it is possible to obtain information about the place of generation of the electromagnetic noise and the passage of the electromagnetic noise. Further, the data processing apparatus according to the present exemplary embodiment has a function to calculate the "offset value" of the coordinate of the electromagnetic field probe 20 with respect to the coordinate of the target of measurement.

Specifically, as shown in FIG. 5, the data processing apparatus has a coordinate controller 51, a GPIB interface 52, an electromagnetic field distribution plotter 53, a distribution analyzer 54, and a correction value calculator 55. The measuring instrument 40 is connected to the data processing apparatus via the GPIB interface 52. The electromagnetic field distribution plotter 53 receives a measurement result from the measuring instrument 40 through the GPIB interface 52. Then, the electromagnetic field distribution plotter 53 creates electromagnetic field distribution and plots the electromagnetic field distribution on the basis of the received measurement result.

The distribution analyzer 54 analyzes the created electromagnetic field distribution. More in detail, the distribution analyzer 54 analyzes the electromagnetic field distribution to extract characteristic points from the distribution. As a characteristic point, a peak point (a maximal point), a minimal point, and an inflection point or the like in the electromagnetic field distribution are considered. Then, the distribution analyzer 54 outputs the position (the coordinate value) of the extracted characteristic point to the correction value calculator 55.

The correction value calculator 55 receives the coordinate value of the extracted characteristic point and the wiring design information DAT showing the design of the wiring. Then, the correction value calculator 55 calculates an offset value (a correction value) on the basis of the coordinate value of the received characteristic point and the wiring design information DAT. The calculated offset value is outputted to the coordinate controller 51. The coordinate controller 51 transmits a coordinate control signal corresponding to the calculated offset value to the controller 37 of the scanning device 30. The scanning device 30 is capable of correcting the coordinate value of the electromagnetic field probe 20 for an offset value on the basis of this coordinate control signal.

1-2. Calculation of Offset

Hereinafter, the offset calculation processing by means of the distribution analyzer 54 and the correction value calculator 55 will be described more in detail. For simplifying the explanation, it is assumed that the magnetic field distribution in the X-axis direction is obtained by the magnetic field probe 20A and the offset value of the X coordinate value of the magnetic field probe 20A is calculated. The magnetic field loop 29 is placed in a direction for measuring only an X component of the magnetic field around the wiring 120.

Figure 6A:
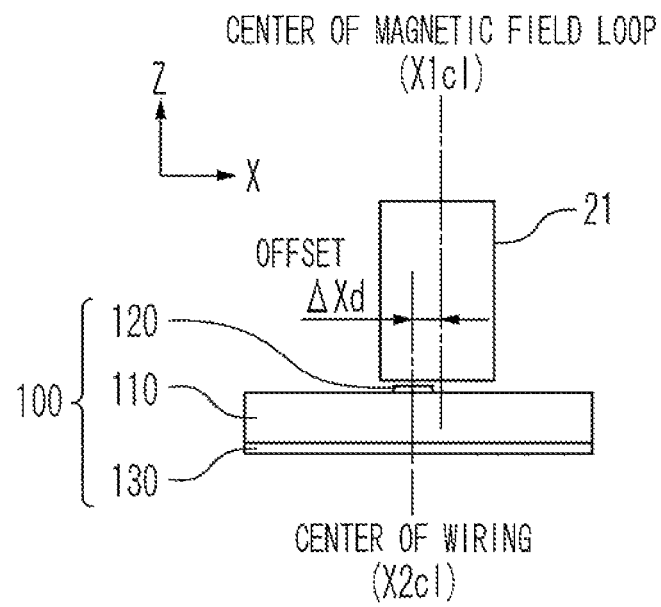
FIG. 6A is a schematic view for explaining a calculation method of an offset value according to the first exemplary embodiment of the present invention.

In FIG. 6A, the product under test 100 has the printed wiring board 110, the wiring 120 formed on the printed wiring board 110, and a ground line 130. Each of the wiring 120 and the ground line 130 forms a microstripline structure. The wiring 120 is a wiring of a product and is a target of measurement of the electromagnetic field distribution. The probe head 21 of the magnetic field probe 20A is operated in the vicinity of this wiring 120. In the present example, the probe head 21 is operated for scanning at predetermined intervals along the X-axis direction with the Y coordinate value and the Z coordinate value constantly maintained. The magnetic field distribution in the X-axis direction measured in this time is as shown in FIG. 6B.

Figure 6B:
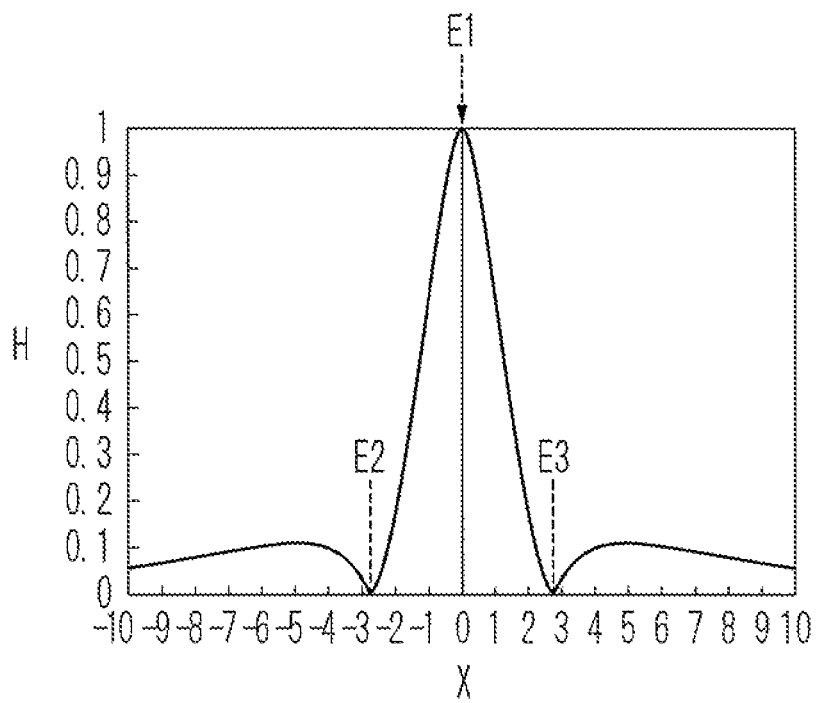
FIG. 6B is a graph showing an example of the electromagnetic field distribution that is measured in a case of FIG. 6A.

In FIG. 6B, the horizontal axis represents the coordinate X for measurement of the magnetic field loop 29 in the magnetic field probe 20A, and the longitudinal axis represents the normalized magnetic field intensity H. Here, it is assumed that a common spectrum analyzer is used as the measuring instrument 40. In the case of using the spectrum analyzer, the measured value is obtained as a frequency-resolved amplitude (the absolute value), and in FIG. 6B, an amplitude of a certain frequency spectrum measured while changing the coordinate X is graphically represented. The value of the longitudinal axis is normalized referring to the maximum value of the magnetic field distribution. In addition, it is assumed that the measured coordinate X is defined on the center axis of the magnetic field loop 29. Further, for simplifying the explanation of a calculation method of an offset value, the measured coordinate value X having the maximum magnetic field distribution is herein represented by 0 as a matter of convenience. Actually, the magnetic field loop 29 is placed on any position on the stage 11 and this position is selected as the original point of the measured coordinate X (X=0) in many cases, so that the machine coordinate X having the maximum magnetic field distribution may be different from the original point. The terms "machine coordinate" here is a coordinate referring to a mechanical original point of the X-axis driving unit. The original point of the measured coordinate may not be coincident with the machine original point, however, for simplicity, it is defined that the measured original point is coincident with the machine original point here.

As shown in FIG. 6B, the magnetic field distribution has a maximal value at a peak point E1, and a shape of this magnetic field distribution is symmetrical across the peak point E1. The peak point (maximal point) E1 corresponds to a case where a center of the magnetic field loop 29 is coincident with a center of the wiring 120. In other words, the output of the magnetic field probe 20A reaches the highest value when the center of the magnetic field loop 29 is coincident with the center of the wiring 120. The shape of the magnetic field distribution is symmetrical to the center of the wiring 120.

The distribution analyzer 54 of the data processing apparatus analyzes the magnetic field distribution shown in FIG. 6B and extracts the above-mentioned peak point E1 as a characteristic point. A simplest method for detecting the peak is a method of checking a difference from a last value. In this case, a fact that the sign of the calculated difference is changed around the coordinate indicating the peak can be utilized. There is possibility that the curve shown in FIG. 6B is not sufficiently smooth to provide a numerical process because of many ambient noises. In this case, for example, by using the smoothing differentiation or the method of polynomial approximation in parallel, it is possible to detect the coordinate of the peak.

The distribution analyzer 54 obtains the coordinate value X1$cl$, which is the coordinate value of the center of the magnetic field loop 29 corresponding to the detected peak point E1. In other words, the coordinate value X1$cl$ (in the example of FIG. 6B, it is 0) showing the maximal value of the magnetic field distribution is calculated. This coordinate value X1$cl$ is defined as "the first reference coordinate" corresponding to the center in the wiring 120. The calculated coordinate value X1$cl$ is outputted to the correction value calculator 55.

The correction value calculator 55 calculates the coordinate value X2$cl$ of the center of the wiring 120 that is a target of measurement from information about a reference position when fixing the wiring design information DAT and the product under test 100 on the stage 11. This coordinate value X2$cl$ is defined as "the second reference coordinate" in the wiring 120. The difference between this coordinate value X2$cl$ (the second reference coordinate) and the above-described coordinate value X1$cl$ (the first reference coordinate) is defined as the offset value ΔXd of the coordinate of the magnetic field probe 20A with respect to the coordinate of the wiring 120 (refer to FIG. 6A). As a result, the correction value calculator 55 calculates the offset value ΔXd from a formula: ΔXd=X2$cl$−X1$cl$.

The calculated offset value ΔXd is sent to the coordinate controller 51 to be used for correction of the position of the magnetic field probe 20A. In a case of moving the magnetic field probe 20A to a coordinate value Xeut of a certain target of measurement, the coordinate controller 51 gives an instruction to the scanning device 30 so as to move the magnetic field probe 20A to a coordinate value Xmech that is given by Xmech=Xeut+ΔXd.

In addition, in a case where each of the wiring 120 and the ground line 130 forms a microstripline structure as shown in FIG. 6A, the magnetic field distribution has two minimal points E2 and E3 being symmetrical on opposite sides of the peak point E1, respectively, as shown in FIG. 6B. It is easy to extract the minimal points E2 and E3 because the shape of the magnetic field distribution around the minimal points E2 and E3 is more sharp-pointed than the shape of the magnetic field distribution around the peak point E1. Accordingly, these minimal points E2 and E3 may be used as characteristic points.

In such a case, the distribution analyzer 54 extracts two minimal points E2 and E3 putting the peak point E1 there between from the magnetic field distribution. As a method of detecting the minimal points E2 and E3, the above-described method of checking the difference or the like may be considered. It is assumed that the coordinates of the centers of the magnetic field loop 29 corresponding to the minimal points E2 and E3 are defined to be Xmr and Xml, respectively. The distribution analyzer 54 calculates an intermediate coordinate between these coordinates Xmr and Xml, namely, an average value between the coordinates Xmr and Xml. This intermediate coordinate of (Xmr+Xml)/2 is coincident with a coordinate value X1$cl$ of the peak point E1. As a result, the calculated intermediate coordinate is outputted to the correction value calculator 55 as the coordinate value X1$cl$. In the case where the minimal points E2 and E3 are easily extracted, it is possible to obtain the coordinate value X1$cl$ with high accuracy.

Figure 6C:
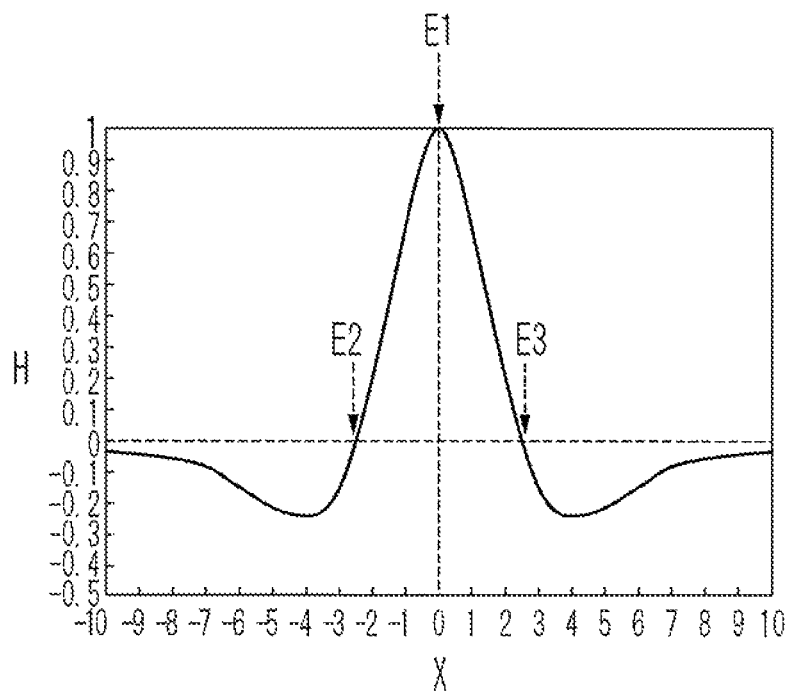
FIG. 6C is a graph in a case where the graph of FIG. 6B is replotted in consideration of the direction of a generated magnetic field.

Further, all of the signs of the distribution curve are plus since the measurement result when the phase component is not measured by the spectrum analyzer is displayed in FIG. 6B. However, in a case of scanning the magnetic field probe 20A on the wiring 120 in the X direction, actually, the orientation of the X component of the magnetic filed is reversed during the scanning. Accordingly, in a case where an output waveform of the magnetic field probe 20A is directly measured by a waveform measuring instrument such as an oscilloscope, for example, a graph shown in FIG. 6C is obtained. In FIG. 6C, two cross points between the distribution curve and H=0 correspond to the minimal points E2 and E3 in FIG. 6B. Accordingly, by extracting these two cross points as characteristic points, the coordinate value X1cl that corresponds to the peak point E1 may be calculated.

Figure 6D:
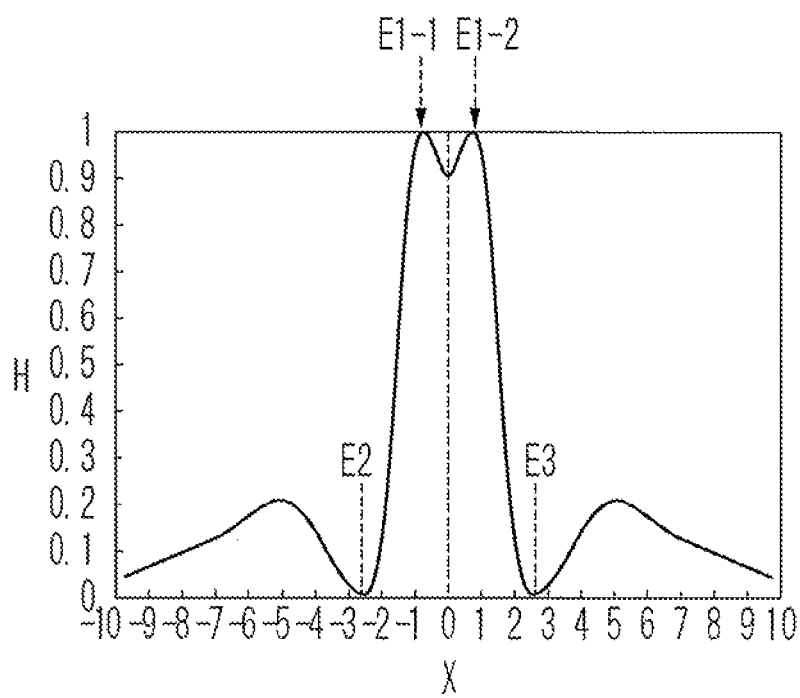
FIG. 6D is a graph showing an example of the electromagnetic field distribution having a plurality of peaks, which is measured in the case of FIG. 6A.

In addition, in a case where the spatial resolution of the magnetic field probe 20A is sufficiently high, two peaks appearing due to the skin effect may be detected on the opposite sides of the wiring 120. FIG. 6D is a graph showing a magnetic field distribution in this case. As shown in FIG. 6D, two peak points (the maximal points) E1-1 and E1-2 are appearing. The magnetic field distribution takes the same maximal values at two peak points E1-1 and E1-2, and the value of the longitudinal axis is normalized referring to this maximal value. As well as a case where two minimal points E2 and E3 are used as the characteristic points, it is possible to calculate the coordinate value X1cl from the coordinates of two peak points E1-1 and E1-2.

The procedure of calculating the offset value by measuring the magnetic field distribution in the X direction with the magnetic field probe 20A has been described so far. However, in a case of measuring other components of the magnetic field and measuring the electromagnetic field distribution by using an electric field probe, it is also possible to obtain the offset value in the same procedure. A plurality of the minimal points may appear in place of the peak point, and in such a case, the offset value can also be obtained in the same procedure. It can also be considered that a maximal point and a minimal point is extracted by making a differential calculation with respect to X with the magnetic field distribution regarded as a function of X and making the magnetic field distribution sharp-pointed.

1-3. Effect

As described above, according to the present exemplary embodiment, by utilizing the characteristic point in the electromagnetic field distribution, the offset value ΔXd is calculated, and on the basis of this offset value ΔXd, the alignment (correction of the position) is carried out. According to the conventional technique, a coordinate of a point that is capable of being observed from the outside of the probe head (the coordinate value of the edge of the probe head) is visually adjusted to a reference coordinate that is decided in the wiring (the coordinate value of the edge of the wiring). However, according to the present exemplary embodiment, there is no necessity of such process. As a result, error caused in visual alignment can be eliminated. According to the present exemplary embodiment, it is possible to enhance the accuracy of the alignment between the magnetic field loop 29 and a target of measurement, which alignment is important for detection of the magnetic field.

Further, according to the present exemplary embodiment, there is no necessity to visually observe edges of the probe head 21 and the wiring 120. Accordingly, even in a case where either the probe head 21 or the wiring 120 cannot be visually observed, it is possible to carry out the alignment with high accuracy. For example, if the product under test 100 is a printed wiring board, an integrated circuit chip, an interposer or the like of the product, the wiring 120 is not necessarily exposed on the surface of them. Even in such a case, according to the present exemplary embodiment, it is possible to accurately calculate the offset value ΔXd by using the electromagnetic field that leaks to the outside and carry out the correction of the position.

The correction of the position according to the present invention can be utilized for a versatile application other than measurement of the electromagnetic filed distribution. For example, the present invention can also be applied to the correction of the position upon manufacturing of a printed wiring board and the correction of the position upon mounting of components or the like.

2. Second Exemplary Embodiment

According to the first exemplary embodiment, the correction of the position is carried out by using the wiring 120 that is necessary for a function of the product. In place of this, the correction of the position may be carried out by forming a wiring 120 intended for dedicated use to the correction of the position on the product under test 100 in advance. In this case, it is possible to actively control the electromagnetic field around the wiring 120, and this contributes to the enhancement of the accuracy of the correction of the position. According to a second exemplary embodiment of the present invention, the wiring 120 intended for dedicated use to the correction of the position is used.

FIG. 7 is a block diagram showing a configuration of the electromagnetic field distribution measurement apparatus 10 according to the second exemplary embodiment of the present invention. Same reference numerals are given to the same configurations as those of the first exemplary embodiment shown in FIG. 5, and the redundant descriptions are accordingly omitted. As shown in FIG. 7, the electromagnetic field distribution measurement apparatus 10 according to the present exemplary embodiment is further provided with a signal generator 60. This signal generator 60 excites the wiring 120 intended for dedicated use to the correction of the position, and thereby, a characteristic electromagnetic field is generated around the wiring 120. The magnetic field probe 20A measures the electromagnetic field distribution in the vicinity of the wiring 120 while the signal generator 60 is exciting the wiring 120.

In addition, the data processing apparatus according to the present exemplary embodiment further has an electromagnetic field distribution controller 56. This electromagnetic field distribution controller 56 controls the excitation of the wiring 120 by means of the signal generator 60. Specifically, the electromagnetic field distribution controller 56 transmits the control information about a frequency, a phase, and a waveform or the like to the signal generator 60. The signal generator 60 excites the wiring 120 in response to this control information. In addition, this control information is also transmitted to the distribution analyzer 54. The distribution analyzer 54 is capable of extracting the following various characteristic points from the electromagnetic field distribution in response to the content of the control indicated by the control information.

2-1. First Example

Figure 8:
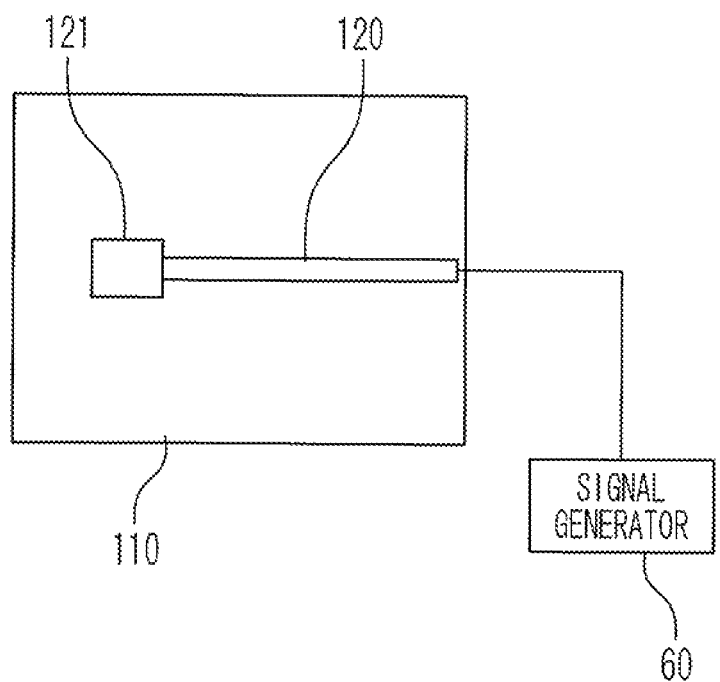
FIG. 8 is a schematic view for explaining an example of a calculation method of an offset value according to the second exemplary embodiment of the present invention.

FIG. 8 is a diagram for explaining the simplest case. In FIG. 8, a piece of wiring 120 for the correction of the position is formed on the printed wiring board 110. It is assumed that the wiring 120 forms a microstrip line as well as the case of FIG. 6A. The signal generator 60 is connected to the wiring 120 forming the single microstrip line and the ground line 130. The signal generator 60 generates a desired electromagnetic field distribution by providing a signal in response to control information of the electromagnetic field distribution (the waveform, the amplitude, the phase, the modulation, the duration time, and others) to this single microstrip line. Then, as well as the first exemplary embodiment, the offset value ΔXd is calculated. Further, a terminal resistance 121 is connected to a terminal of the wiring 120. In response to the waveform that is desired to be generated, components different from the terminal resistance 121 may be used.

2-2. Second Example

FIG. 9A is a diagram for explaining a second example. In FIG. 9A, a first wiring 120*a* and a second wiring 120*b* for correction of a position are formed on the printed wiring board 110. These wirings 120*a* and 120*b* are formed close to each other approximately in parallel. Further, for simplifying the explanation, it is assumed that widths of two wirings are made to be a same size; however, the widths of the wirings may not be necessarily the same in fact. In addition, for easy decision of the coordinates of the intermediate point or the center of the wiring, parallel wirings are illustrated; however, the present invention can also be applied to a case whose wirings are not parallel. As well as the first example, each of the wiring 120*a* and the wiring 120*b* forms a microstrip line. The signal generator 60 includes a signal generator 60*a* and a signal generator 60*b*, which are connected to each of two adjacent wirings, namely, the wiring 120*a* and the wiring 120*b*, respectively.

According to the present example, the signal generator 60*a* and the signal generator 60*b* provide signals of the same phase to the first wiring 120*a* and the second wiring 120*b*, respectively, at same frequency. In other words, the first wiring 120*a* and the second wiring 120*b* that are located adjacent to each other are excited by a signal of a same frequency and a same phase. The magnetic distribution in the X-axis direction to be measured in this case is as shown in FIG. 9B.

Figure 9B:
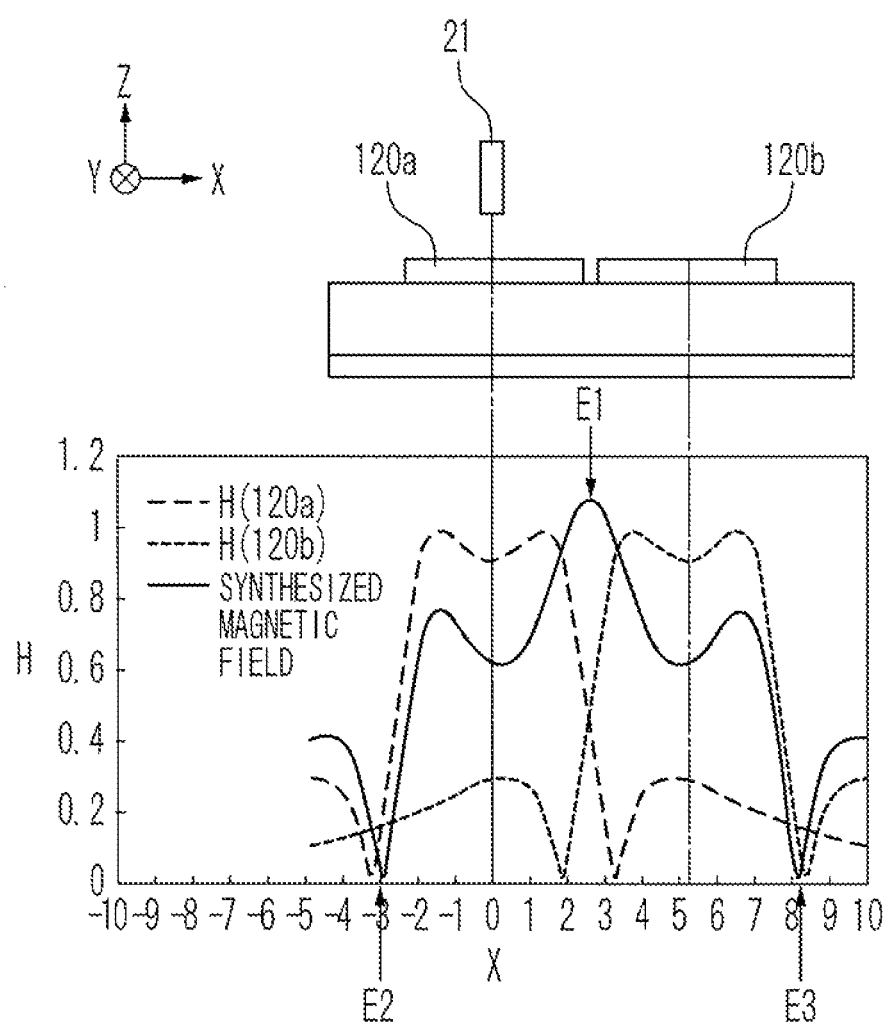
FIG. 9B is a graph showing an example of the electromagnetic field distribution that measured in the case of FIG. 9A.

In FIG. 9B, a broken line and a dashed line indicate a distribution (amplitude) of a magnetic field generated from the first wiring 120*a* and the second wiring 120*b*, respectively. The magnetic field distribution measured by the magnetic field probe 20A is the sum of these two distributions and this sum is represented by a solid line. Here, the solid line is calculated not as the simple sum of the broken line and the dashed line that are illustrated but as the vector sum of the magnetic field distributions represented by these broken line and dashed line. In the case where the excitation conditions of two wirings are equal, the shape of the magnetic field distribution illustrated by the solid line is symmetrical but this shape becomes complex because two distributions overlap each other. Further, in FIG. 9B, amplitude that is measured by a spectrum analyzer is plotted being normalized regarding the maximum value of the magnetic field of each wiring. Accordingly, the maximum value of the synthesized magnetic field is larger than 1.

In a case where signals of a same phases are provided to the adjacent wirings 120*a* and 120*b*, the X components of the magnetic fields intensify each other at an intermediate position between these wirings 120*a* and 120*b*. In other words, as shown in FIG. 9B, the peak point E1 of the magnetic filed distribution corresponds to the intermediate position between these wirings 120*a* and 120*b*. When the center of the magnetic field loop 29 is coincident with the intermediate point between the wirings 120*a* and 120*b*, the output of the magnetic field probe 20A reaches the highest value.

Accordingly, the distribution analyzer 54 of the data processing apparatus extracts the peak point E1 in FIG. 9B as a characteristic point. Then, the distribution analyzer 54 calculates the coordinate of the center X1*cl* of the magnetic field loop 29 of the magnetic field probe 20A corresponding to that peak point E1. This coordinate value X1*cl* is "the first reference coordinate" corresponding to the intermediate position between two wirings 120*a* and 120*b*. The distribution analyzer 54 outputs the coordinate value X1*cl* to the correction value calculator 55.

The correction value calculator 55 obtains the coordinates of the centers of the wirings 120*a* and 120*b*, respectively, from the wiring design information DAT and the information about a reference position when fixing the product under test 100 on the stage 11, and calculates an intermediate coordinate (the average value) X2*g* between these two coordinates. This intermediate coordinate X2*g* is "the second reference coordinate" of two wirings 120*a* and 120*b*. Accordingly, as well as the first exemplary embodiment, the correction value calculator 55 calculates the offset value ΔXd from a formula: ΔXd=X2*g*−X1*cl*.

In addition, as shown in FIG. 9B, the magnetic field distribution has two minimal points E2 and E3 being symmetrical on the opposite sides of the peak point E1, respectively. As well as the first exemplary embodiment, these minimal points E2 and E3 may be used as the characteristic points. In the case where the coordinates of the centers of the magnetic field loop 29 corresponding to the minimal points E2 and E3 are defined to be Xmr and Xml, respectively, the distribution analyzer 54 calculates the coordinate value X1*cl* from a formula: X1*cl*= (Xmr+Xml)/2. Subsequent processing is the same as the first exemplary embodiment.

Further, when the spatial resolution of the magnetic field probe 20A is sufficiently high, two maximal points may appear on the opposite sides of the peak E1. In this case, the coordinate value X1*cl* can also be calculated as well as the case of using the minimal points E2 and E3.

As described above, according to the second example, two wirings 120*a* and 120*b* are provided, and the excitation is controlled so that the magnetic field distribution has a maximal value between these wirings. When the spatial resolution of the magnetic field probe 20A is high, as shown in FIG. 6D, two peaks clearly appear with respect to each wiring and these two peaks may be capable of being used for calculation of the coordinate. However, depending on a relation between the spatial resolution of the magnetic field probe 20A and the sizes of respective parts of the wirings, the peak does not appear so clearly and this leads to a flat distribution. Under such a condition, it is difficult to detect the coordinate of the peak; however, by using two parallel wirings as the present example, it is possible for the peak to clearly appear. In addition, even in a case where the sensitivity of the magnetic field probe 20A is low, it is advantageous because the maximum value of the synthesized magnetic field is larger than the maximum value of the magnetic field of each wiring. Thereby, the accuracy of the position correction is enhanced. Not only the peak point E1 but also the peaks and the maximal points appearing in other parts of the distribution may be capable of being used for the calculation of the reference coordinate such as an intermediate point of the wirings or the like. Further, more than three wirings 120 for detection of the position may be provided. In such a case, it is also possible to calculate the offset value ΔXd by generating the sharp-pointed magnetic field distribution according to the similar idea. The cases of using the electric field and using the components in other directions of the magnetic field are the same.

2-3. Third Example

Figure 10A:
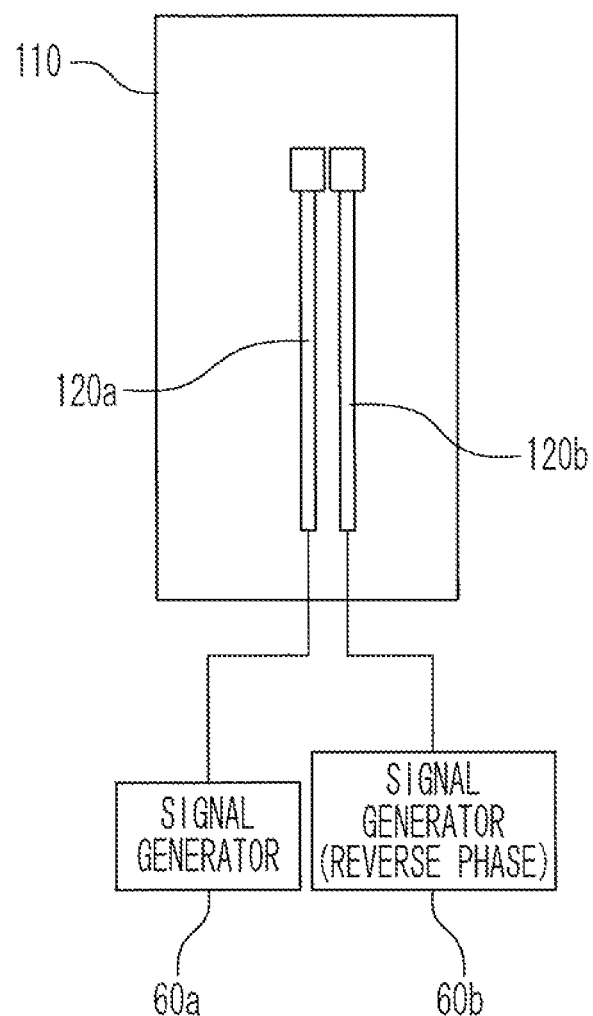
FIG. 10A is a schematic view for explaining further another example of the calculation method of the offset value according to the second exemplary embodiment of the present invention.

FIG. 10A is a diagram for explaining a third example. The explanations redundant to the second example are herein omitted accordingly. As well as the second example, also in FIG. 10A, the first wiring 120*a* and the second wiring 120*b* for the detection of the position are also formed. However, according to the present example, the signal generator 60a and the signal generator 60b excite the first wiring 120a and the second wiring 120b with signals having reverse phases, respectively.

Figure 10B:
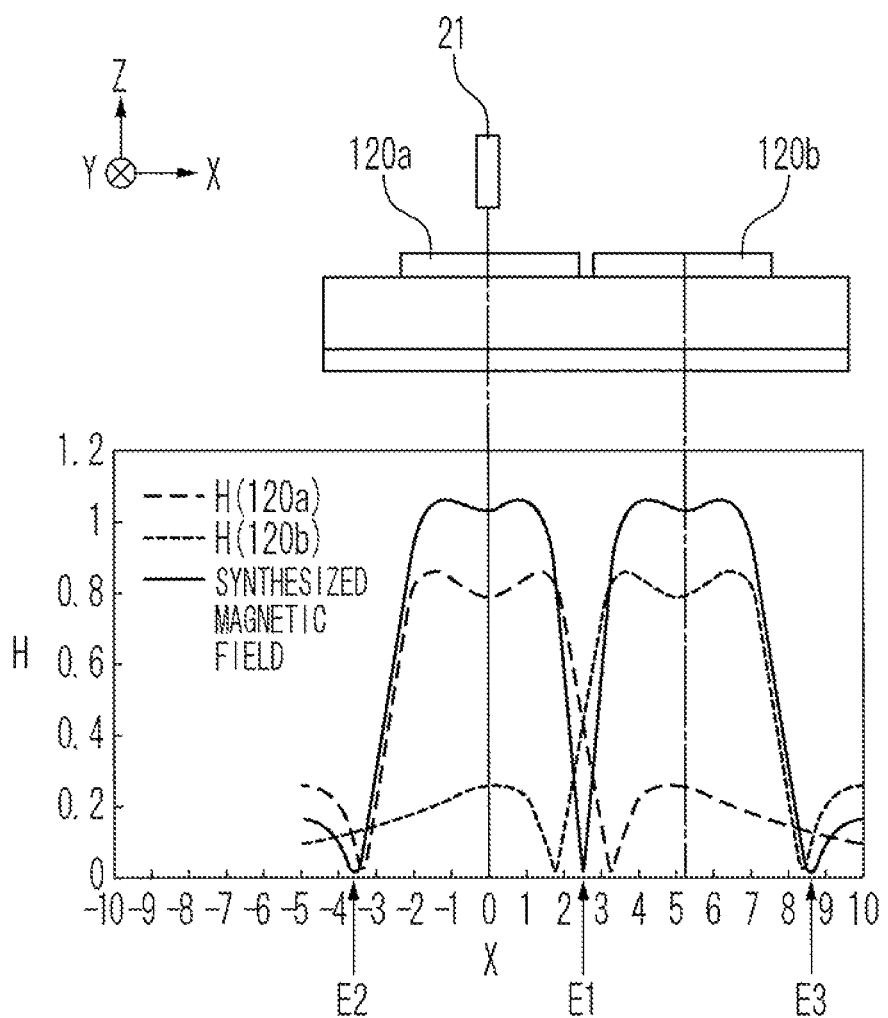
FIG. 10B is a graph showing an example of the electromagnetic field distribution that is measured in the case of FIG. 10A.

Magnetic field distribution in the X-axis direction that is measured in this case is as shown in FIG. 10B. When signals having reverse phases are provided to the adjacent wirings 120a and 120b, the X components of the magnetic fields weaken each other at an intermediate position between these wirings 120a and 120b. As a result, as shown in FIG. 10B, the magnetic field distribution has a minimal point E1 at the intermediate position between the wiring 120a and the wiring 120b. The magnetic field distribution is rapidly changed around the minimal point E1, so that the accuracy of the coordinate detection of the minimal point E1 is made higher. Further, if the spatial resolution of the magnetic field probe 20A is accurately known, it is possible to make the minimal points of the distributions due to the wirings 120a and 120b coincident with each other, and this makes it possible to enhance the accuracy of measurement of the coordinate of the minimal point E1.

The distribution analyzer 54 extracts the minimal point E1 in the FIG. 10B as a characteristic point. Then, the distribution analyzer 54 outputs the coordinate value X1cl of the center of the magnetic field loop 29 corresponding to the minimal point E1 to the correction value calculator 55. Alternatively, as well as the second example, by using two minimal points E2 and E3 collaterally, the coordinate value X1cl may be calculated. The subsequent processing is the same as the second example.

As described above, according to the third example, two wirings 120a and 120b are provided, and the excitation is controlled so that the magnetic field distribution has a minimal value between these wirings. In other words, the third example is designed to obtain characteristic magnetic field distribution that is suitable for extracting a characteristic point. Thereby, the accuracy of the position correction is enhanced. Further, more than three wirings 120 for detection of the position may be provided. In such a case, it is also possible to calculate the offset value ΔXd according to the similar idea. The case of the use of an electric field and a case of the use of the components in other directions of the magnetic field are the same.

2-4. Fourth Example

Figure 11A:
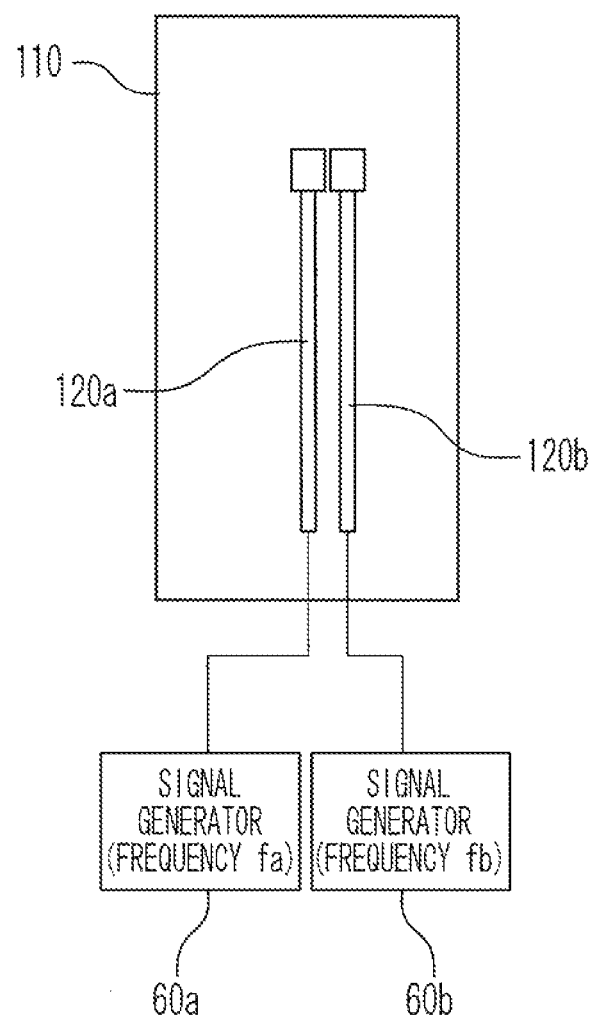
FIG. 11A is a schematic view for explaining further another example of the calculation method of the offset value according to the second exemplary embodiment of the present invention.

FIG. 11A is a diagram for explaining a fourth example. Explanations redundant to the second example are herein omitted. As well as the second example, also in FIG. 11A, the first wiring 120a and the second wiring 120b for the correction of the position are also formed. However, according to the present example, the signal generator 60a excites the first wiring 120a with a signal of a frequency fa and the signal generator 60b excites the second wiring 120b with a signal of a frequency fb.

Particularly in the present example, the frequency fa is different from the frequency fb. In other words, signals having different frequencies fa and fb are provided to two wirings 120a and 120b, respectively. By means of the measuring instrument 40 such as the spectrum analyzer, different magnetic field distributions are obtained with respect to each of two frequencies fa and fb. If the frequencies fa and fb are not considerably different from each other, respective magnetic field distributions have little dependencies on the frequencies. In addition, by broadening the measurement band of the spectrum analyzer, two frequency spectrums corresponding to fa and fb become located in a same measurement band, the measurement time can be shortened.

Figure 11B:
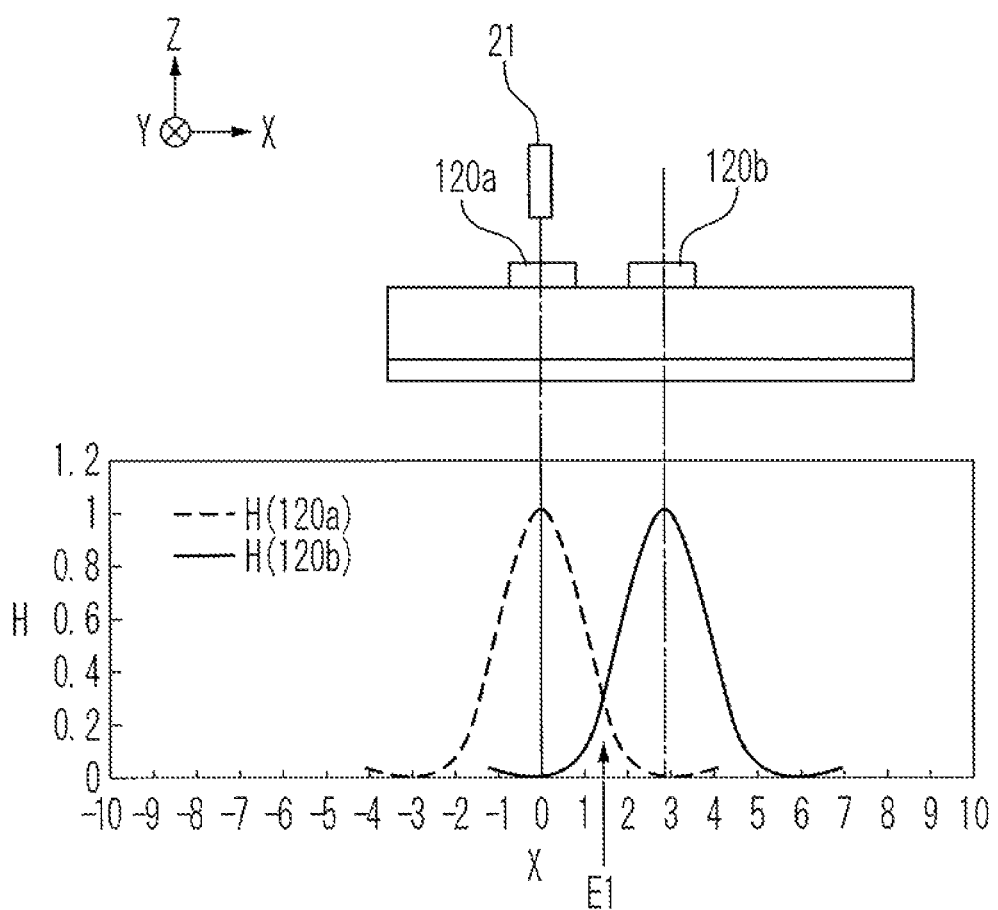
FIG. 11B is a graph showing an example of the electromagnetic field distribution that is measured in the case of FIG. 11A.

FIG. 11B illustrates two magnetic field distributions that are measured in the present example with two magnetic field distributions overlapping each other. A broken line represents the magnetic field distribution that is measured in the vicinity of the first wiring 120a, namely, the magnetic field distribution with respect to the frequency fa. On the other hand, the solid line represents the magnetic field distribution that is measured in the vicinity of the second wiring 120b, namely, the magnetic field distribution with respect to the frequency fb.

The distribution analyzer 54 of the data processing apparatus overlaps two magnetic field distributions with each other, and extracts the cross point E1 between two magnetic field distributions as a characteristic point. This cross point E1 corresponds to an intermediate point between two wirings 120a and 120b. Accordingly, the distribution analyzer 54 outputs the coordinate value X1cl of the center of the magnetic field loop 29 corresponding to this cross point E1 to the correction value calculator 55. Subsequent processing is the same as the second example.

The distribution analyzer 54 may have a function to compare the sizes of the magnetic fields that are measured with respect to each of two frequencies fa and fb. In this case, the distribution analyzer 54 is capable of extracting the point E1 where the sizes of respective magnetic fields are equal as a characteristic point. Alternatively, the distribution analyzer 54 is capable of extracting the point E1 where the difference between respective magnetic fields becomes 0 as a characteristic point.

The procedure that has been described according to the present example is effective for a case where the shape of the magnetic field distribution is totally spread and changing of the shape is slow. For example, depending on the widths of the wirings 120a and 120b and the thickness of the substrate, changing in the vicinity of the peak value of the magnetic field distribution may be slow. In addition, two minimal points which should appear on the opposite sides of the peak value may almost disappear. Alternatively, in a case where no ground line 130 exists, the minimal point does not appear literally. Even in such cases, according to the procedure that has been described in the present example, it is possible to accurately extract the characteristic point E1.

2-5. Fifth Example

A fifth example is effective for the case where the frequencies fa and fb cannot be separated in the above-described fourth example. In the fifth example, the frequencies fa and fb have the similar values as those above but they are close to each other. In this case, when the wirings 120a and 120b are excited at the same time, it is not possible to separate the obtained two magnetic field distributions. In this case, there is no problem if the distributions shown in FIGS. 9B and 10B are obtained, however, there is a possibility that such distributions are not obtained. Accordingly, in the present example, the wirings 120a and 120b are excited at different timings. In other words, two wirings 120a and 120b are alternately excited with the signals having the same frequencies. A control signal is transmitted to the spectrum analyzer for each excitation, and measurement is carried out at each timing.

Figure 12A:
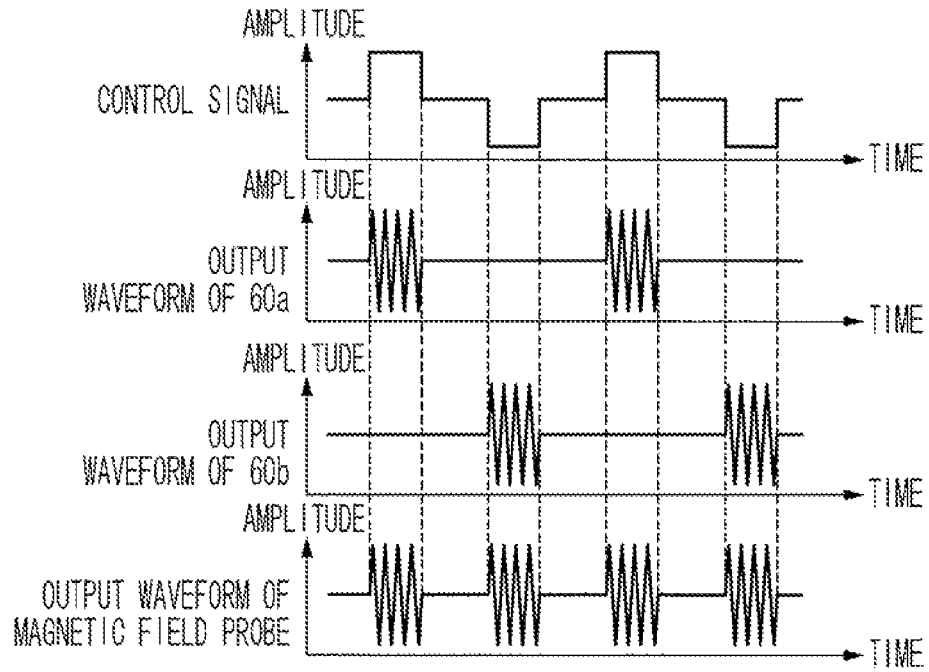
FIG. 12A is a graph for explaining further another example of the calculation method of the offset value according to the second exemplary embodiment of the present invention.

For example, the control as shown in FIG. 12A can be considered. The electromagnetic field distribution controller 56 transmits a control signal as illustrated in the top part of FIG. 12A to the signal generators 60a and 60b. Thereby, in the signal generators 60a and 60b, oscillation is generated at each timing. Although time intervals of the oscillations of respective signal generators are decided depending on the performance and the accuracy of the measuring instrument, these time intervals may be in a range of tens of milliseconds to a few seconds. The signal generators 60a and 60b provide signals having the illustrated waveforms to two wirings 120a and 120b, respectively. As shown in FIG. 12A, each of the two wirings 120a and 120b is excited at predetermined intervals. In addition, these two wirings 120a and 120b are excited alternately. Upon measurement of output waveforms or frequency spectrums from the magnetic field probe 20A, the measuring instrument 40 identifies the excited wiring on the basis of the status of the control signal shown in FIG. 12A (H or L). By separating the output from the magnetic field probe 20A, respective magnetic field distributions as shown in FIG. 11B can be obtained. In a case of exciting the wirings while changing the wirings not by automatic processing but by hand, a control signal is used collaterally since there is no possibility to confuse the excited wiring with the unexcited wiring. The subsequent processing is the same as the forth example.

2-6. Sixth Example

Figure 12B:
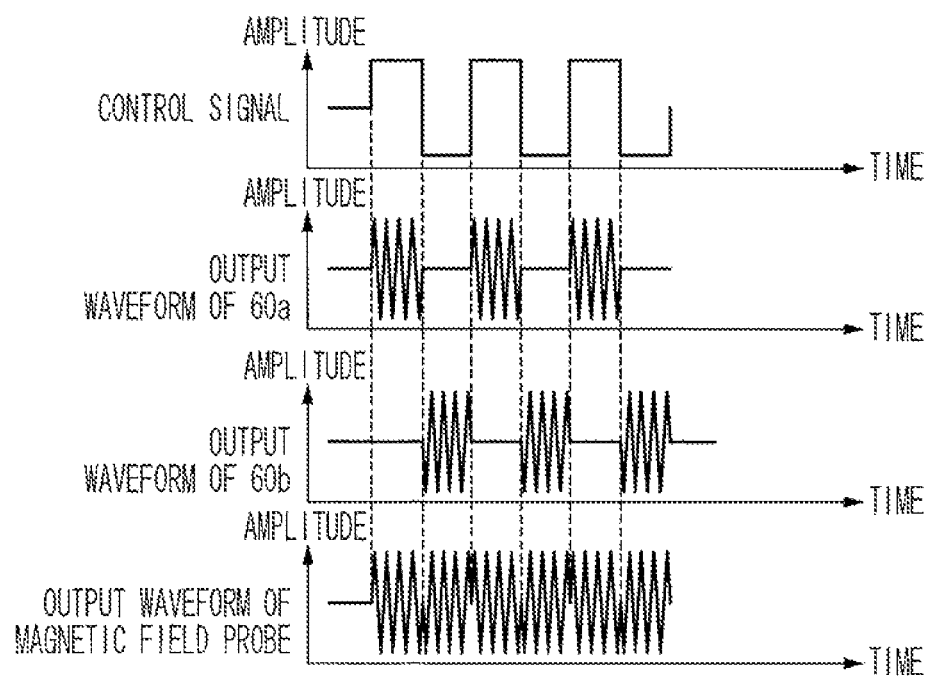
FIG. 12B is a graph for explaining further another example of the calculation method of the offset value according to the second exemplary embodiment of the present invention.

A system that not only outputs the signal from the signal generators 60a and 60b alternately but also shifts a phase of the oscillation waveform can also be considered. For example, the control as shown in FIG. 12B is possible. The electromagnetic field distribution controller 56 transmits a control signal as illustrated in the top part of FIG. 12B to the signal generators 60a and 60b. Thereby, in the signal generators 60a and 60b, oscillation is carried out at each timing. The signal generators 60a and 60b supply signals having illustrated waveforms to two wirings 120a and 120b, respectively. As shown in FIG. 12B, two wirings 120a and 120b are excited alternately, and the phase of the excitation waveform of the wiring 120a is reversed to a phase of an excitation waveform of the wiring 120b.

In the already-mentioned system shown in FIG. 12A, the phases are same, so that the signal generators should generate oscillation oscillated at appropriate intervals. On the other hand, in the system shown in FIG. 12B, even if waveforms are continuously generated, it is possible to identify the signal generator that is generating a magnetic field from the phase information. In other words, information of the excited wiring is included in an output from the magnetic field probe 20A, so that it is possible to identify the excited wiring even if no control signal is transmitted from the electromagnetic field distribution controller 56. Further, a measurement time can be shortened. By separating an output from the magnetic field probe 20A, it is possible to obtain respective electromagnetic distributions as shown in FIG. 11B. The subsequent processing is the same as the fourth example.

2-7. Seventh Example

The signal generators 60a and 60b shown in FIG. 11A excite the wirings 120a and 120b with the different frequencies fa and fb at the same time, respectively. In this case, as shown in FIG. 11B, magnetic field distributions due to respective wirings are observed at the same time. In this time, by bringing the frequencies fa and fb close to each other, the output waveform of the magnetic field probe 20A includes a beat component. The beat component reaches a maximal value at a coordinate value where the intensity of the magnetic field from the wiring 120a becomes equal to the intensity of the magnetic field from the wiring 120b. In other words, the beat component reaches a maximal value at an intermediate point between two wirings 120a and 120b. As a result, by checking change in the beat component while performing scanning by the magnetic field probe 20A, it is possible to calculate the coordinate of the intermediate point between the wiring 120a and the wiring 120b. The data processing apparatus extracts the beat component that is included in an output of the magnetic field probe 20A and calculates the coordinate value X1$cl$ from the coordinate value corresponding to a maximal value of the beat component. The subsequent processing is the same as the fourth example.

3. Third Exemplary Embodiment

Figure 13A:
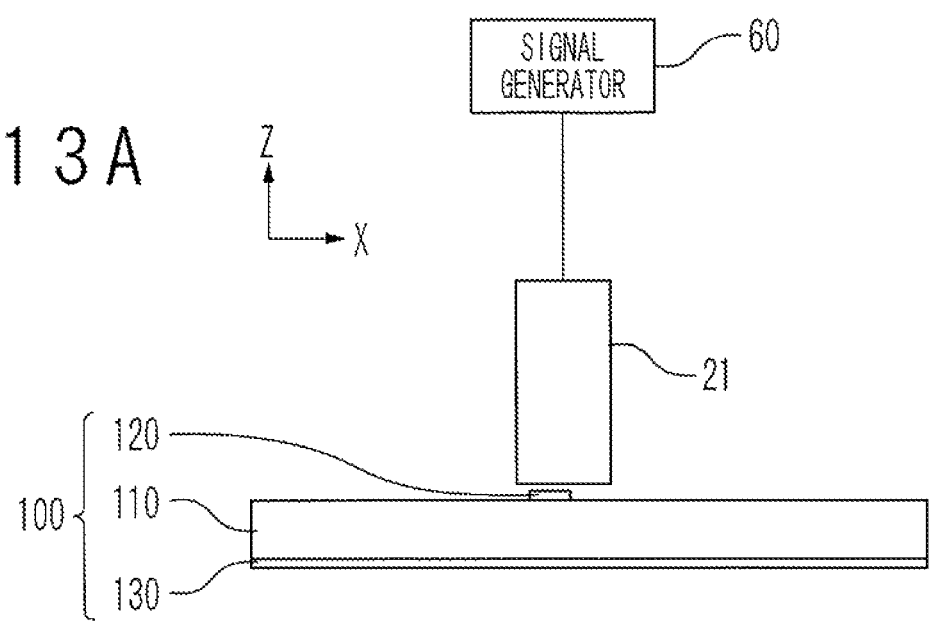
FIG. 13A is a schematic view for explaining a calculation method of an offset value according to a third exemplary embodiment of the present invention.

According to a third exemplary embodiment of the present invention, the electromagnetic field probe 20 is configured so as to generate an electromagnetic field. For example, as shown in FIG. 13A, the signal generator 60 is connected not to the wiring 120 but to the electromagnetic field probe 20 to excite that electromagnetic field probe 20. Thereby, an electromagnetic wave is irradiated from the probe head 21 of the electromagnetic field probe 20 to the wiring 120. A voltage is induced in the wiring 120 by this irradiation of the electromagnetic wave.

Figure 13B:
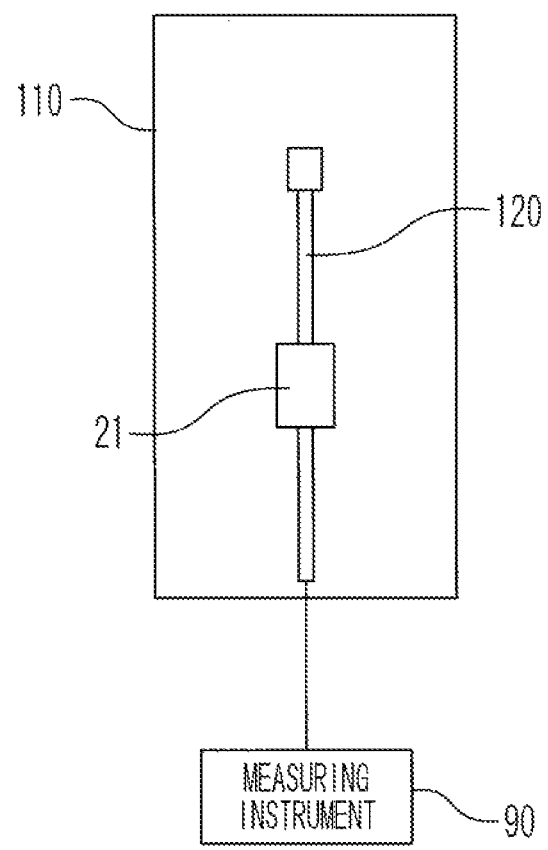
FIG. 13B is a schematic view for explaining the calculation method of the offset value according to the third exemplary embodiment of the present invention.

As shown in FIG. 13B, a measuring instrument 90 is connected to the wiring 120. This measuring instrument 90 measures a voltage to be induced in the wiring 120. By scanning the wiring 120 by the probe head 21, it is possible to obtain the distribution that is equivalent to the electromagnetic distribution (for example, refer to FIG. 6B) illustrated by the already-described exemplary embodiments. The data processing apparatus receives the measurement result from the measuring instrument 90 to calculate the offset value $\Delta Xd$ on the basis of this measurement result.

4. Forth Exemplary Embodiment

Figure 14:
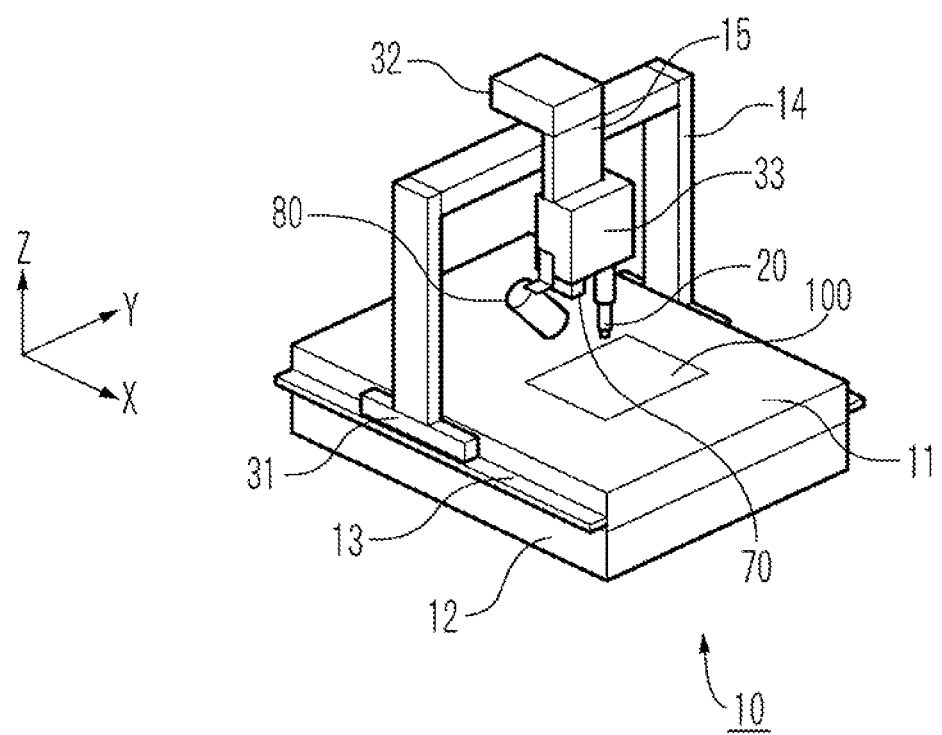
FIG. 14 is an overall view showing a configuration of an electromagnetic field distribution measurement apparatus according to a fourth exemplary embodiment of the present invention.

FIG. 14 is an overall view showing a configuration of the electromagnetic field distribution measurement apparatus 10 according to the fourth exemplary embodiment of the present invention. The electromagnetic field distribution measurement apparatus 10 according to the present exemplary embodiment is provided with a laser 70 and a camera 80 in addition to the configuration shown in FIG. 3. The laser 70 is fixed to the measuring arm 15 or the Z-axis driving unit 33. This laser 70 irradiates laser beams to the wiring 120 that is a target of measurement. The camera 80 takes images of the wiring 120, to which the laser beams are irradiated. According to the present exemplary embodiment, by irradiating the laser beams to a surface of the wiring 120, the coordinate of that wiring 120 is obtained.

Figure 15:
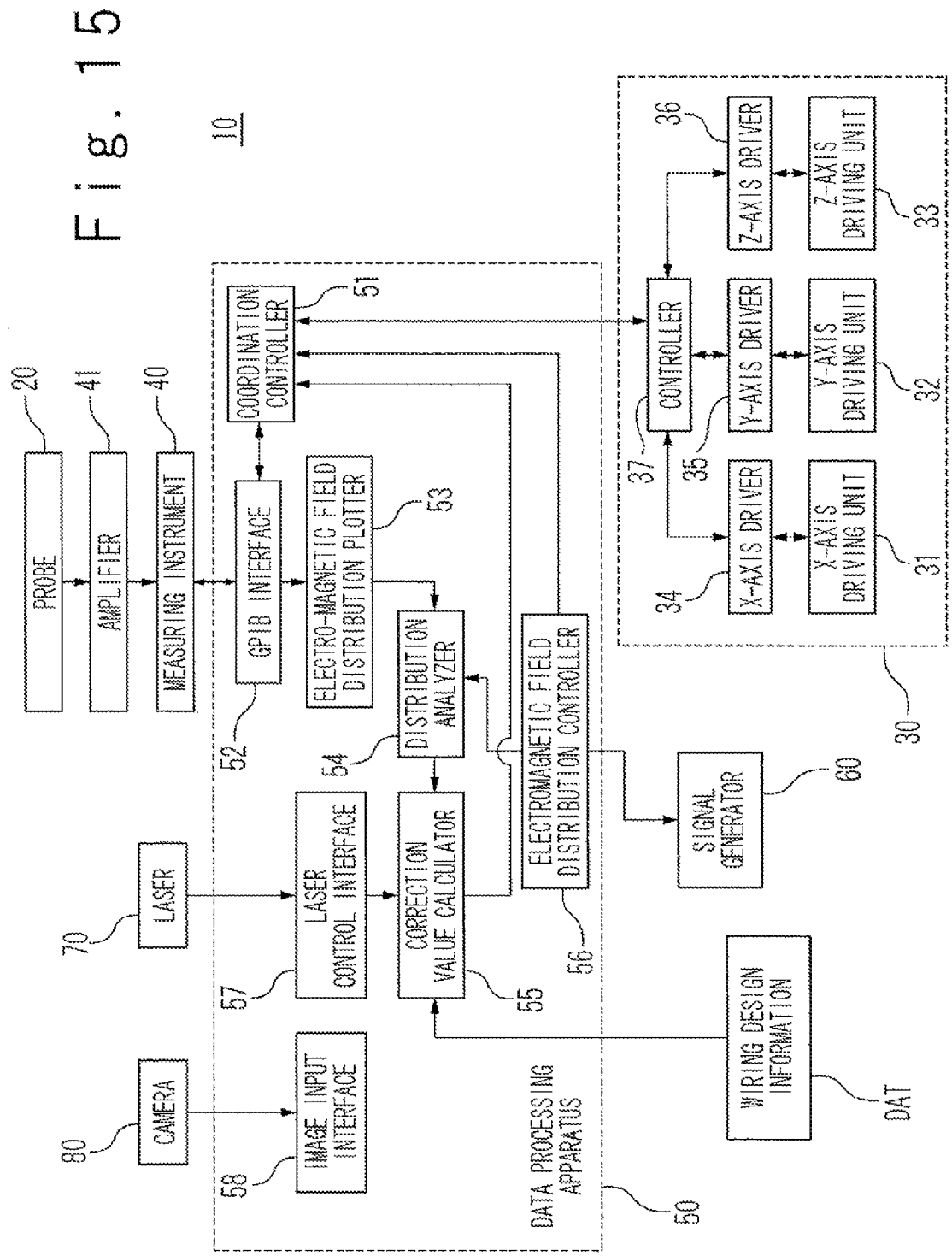
FIG. 15 is a block diagram showing the configuration of the electromagnetic field distribution measurement apparatus according to the fourth exemplary embodiment of the present invention.

FIG. 15 is a block diagram showing a configuration of the electromagnetic field distribution measurement apparatus 10 according to the present exemplary embodiment of the present invention. According to the present exemplary embodiment, the data processing apparatus is provided with a laser control interface 57 and an image input interface 58 in addition to the configuration shown in FIG. 7. The laser 70 is connected to the laser control interface 57. The camera 80 is connected to the image input interface 58.

Figure 16A:
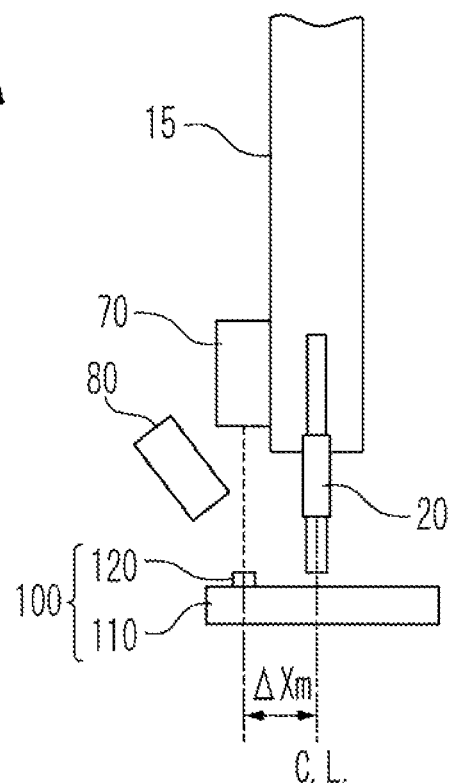
FIG. 16A is a schematic view for explaining a calculation method of an offset value according to the fourth exemplary embodiment of the present invention.

FIG. 16A is a diagram for explaining a calculation method of an offset value according to the present exemplary embodiment. The laser 70 irradiates a laser beam of a small spot diameter to the surface of the wiring 120. In addition, the position of the laser 70 is controlled so that the center of the spot of that laser beam is located on the center of the wiring 120. In this time, the images taken by the camera 80 are used.

When the camera 80 confirms that the center of a spot of the laser beam is located on the center of the wiring 12C, a machine coordinate X2lazer of the laser 70 in that time is read.

Figure 16B:
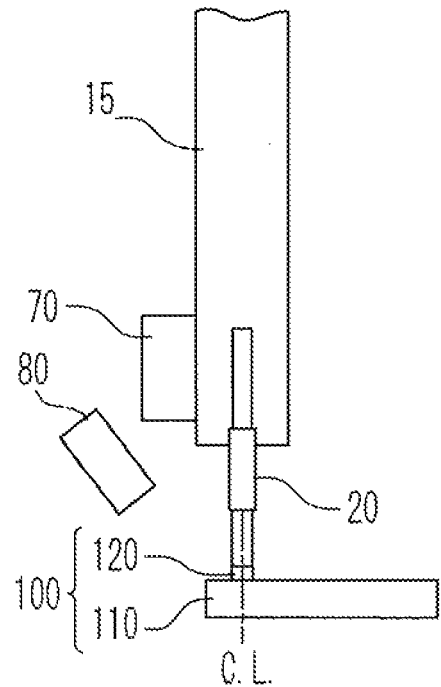
FIG. 16B is a schematic view for explaining the calculation method of the offset value according to the fourth exemplary embodiment of the present invention.

The read machine coordinate X2lazer is transmitted from the laser control interface 57 to the correction value calculator 55. The correction value calculator 55 uses the received machine coordinate X2lazer as the coordinate value X2$cl$ of the center of the wiring 120. Specifically, the correction value calculator 55 calculates the offset value ΔXm from the formula: ΔXm=X2lazer−X1$cl$. The calculated offset value ΔXm is transmitted to the coordinate controller 51 to be used for correction of the position of the electromagnetic field probe 20. Specifically, the operator moves the laser 70 to a coordinate value of the target of measurement while observing the spot of the laser beam by the camera 80. The scanning device 30 further moves the electromagnetic field probe 20 from that state by the calculated offset value ΔXd. Thereby, as shown in FIG. 16B, it is possible to adjust the center of the electromagnetic field probe 20 to the coordinate of the target of measurement.

In the case of using two wirings 120$a$ and 120$b$, each of the coordinate value X2$cll$ of the center of the first wiring 120$a$ and the coordinate value X2$clr$ of the center of the second wiring 120$b$ is measured by the same method. Then, the correction value calculator 55 is capable of calculating the intermediate coordinate X2$g$ from the formula: X2$g$=(X2$cll$+X2$clrs$)/2. The subsequent processing is the same as the second exemplary embodiment.

According to the present exemplary embodiment, the accuracy of detection of the coordinate position is enhanced. The method according to the present exemplary embodiment is effective for a case where the wiring 120 is exposed on a surface of the printed wiring board 110.

The exemplary embodiments of the present invention have been described referring to the attached drawings as above. However, the present invention is not limited to the above-described exemplary embodiments and various modifications will become possible for those skilled in the art without departing from the scope thereof.

What is claimed is:

1. An electromagnetic field distribution measurement apparatus comprising:
    an electromagnetic field probe configured to measure an electromagnetic field distribution;
    a scan apparatus configured to scan a vicinity of wiring with the electromagnetic field probe; and
    a data processing apparatus configured to calculate an offset value of a coordinate of the electromagnetic field probe from a coordinate of the wiring, and
    the data processing apparatus is configured to extract a characteristic point of the measured electromagnetic field distribution, and calculate the offset value based on a coordinate value of the extracted characteristic point.

2. The electromagnetic field distribution measurement apparatus according to claim 1, wherein the data processing apparatus is configured to extract a peak point in the measured electromagnetic field distribution as the characteristic point, calculate a first reference coordinate in the wiring based on the coordinate of the electromagnetic field probe which corresponds to the peak point, calculate a second reference coordinate in the wiring based on design information of the wiring, and calculate a difference of the first reference coordinate and the second reference coordinate.

3. The electromagnetic field distribution measurement apparatus according to claim 1, wherein the wiring forms a microstrip line, and the data processing apparatus is configured to extract two minimal points which sandwich a peak point in the measured electromagnetic field distribution as the characteristic point, calculate a first reference coordinate of the wiring based on two coordinates of the electromagnetic field probe respectively correspond to the two minimal points, calculate a second reference coordinate of the wiring based on design information of the wiring, and calculate a difference of the first reference coordinate and the second reference coordinate as the offset value.

4. The electromagnetic field distribution measurement apparatus according to claim 1, further comprising:
    a signal generator configured to excite the wiring, and
    the electromagnetic field probe measures the electromagnetic field distribution during a period in which the signal generator excites the wiring.

5. The electromagnetic field distribution measurement apparatus according to claim 1, further comprising:
    a signal generator configured to excite the wiring,
    the wiring includes two wirings adjacent to each other,
    the electromagnetic field probe measures the electromagnetic field distribution of the two wirings during a period in which the signal generator excites the two wirings, and
    the data processing apparatus is configured to calculate a first reference coordinate of the two wirings based on a coordinate of the electromagnetic field probe which corresponds to the characteristic point, calculate a second reference coordinate of the two wirings based on design information of the two wirings, and calculate a difference of the first reference coordinate and the second reference coordinate as the offset value.

6. The electromagnetic field distribution measurement apparatus according to claim 5, wherein the signal generator is configured to excite the two wirings by signals of a same phase,
    the electromagnetic field probe measures the electromagnetic field distribution of synthesized field of the electromagnetic fields respectively radiated from the two wirings, and
    the data processing apparatus is configured to extract a peak point or a minimal point in the measured electromagnetic field distribution as the characteristic point.

7. The electromagnetic field distribution measurement apparatus according to claim 5, wherein the signal generator is configured to excite the two wirings by signals of reverse phases,
    the electromagnetic field probe measures the electromagnetic field distribution of synthesized field of the electromagnetic fields respectively radiated from the two wirings, and
    the data processing apparatus is configured to extract a minimal point in the measured electromagnetic field distribution as the characteristic point.

8. The electromagnetic field distribution measurement apparatus according to claim 5, wherein the signal generator is configured to excite the two wirings respectively by signals of different frequencies, and
    the data processing apparatus is configured to overlap the electromagnetic field distributions respectively formed by the different frequencies, and extract an intersection of the electromagnetic field distributions as the characteristic point.

9. The electromagnetic field distribution measurement apparatus according to claim 5, wherein the signal generator is configured to excite the two wirings respectively by signals of different frequencies, and the data processing apparatus is configured to compare electromagnetic fields with each other which are respectively generated by the different frequencies, and extract a point at which magnitudes of the electromagnetic fields are same to each other as the characteristic point.

10. The electromagnetic field distribution measurement apparatus according to claim 5, wherein the signal generator is configured to excite the two wirings alternately, and the data processing apparatus is configured to extract an intersection of electromagnetic fields respectively generated by the two wirings as the characteristic point.

11. The electromagnetic field distribution measurement apparatus according to claim 10, wherein the signal generator is configured to excite the two wirings by signals of different phases.

12. The electromagnetic field distribution measurement apparatus according to claim 5, wherein the signal generator is configured to excite the two wirings by signals whose respective frequencies are different from and close to each other, and the data processing apparatus is configured to extract a beat component included in an output of the electromagnetic field probe, and extract a peak point of the beat component as the characteristic point.

13. The electromagnetic field distribution measurement apparatus according to claim 2, further comprising:

a laser configured to irradiate a laser light to the wiring; and an image taking apparatus configured to take image of the wirings on which the laser light is irradiated, and the data processing apparatus is configured to calculate a coordinate of the laser when a center of the laser light is positioned at a center of the wiring as the second reference coordinate of the wiring.

* * * * *